(12) United States Patent
Kim et al.

(10) Patent No.: US 10,879,225 B2
(45) Date of Patent: Dec. 29, 2020

(54) SEMICONDUCTOR PACKAGE AND METHOD OF MANUFACTURING SEMICONDUCTOR PACKAGE

(71) Applicant: Samsung Electronics Co., Ltd., Suwon-si (KR)

(72) Inventors: Won-Keun Kim, Hwaseong-si (KR); Kyung-Suk Oh, Seongnam-si (KR); Hwa-Il Jin, Seongnam-si (KR); Dong-Kwan Kim, Hwaseong-si (KR); Yeong-Seok Kim, Hwaseong-si (KR); Jae-Choon Kim, Incheon (KR); Seung-Tae Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/430,783

(22) Filed: Jun. 4, 2019

(65) Prior Publication Data

US 2020/0135710 A1    Apr. 30, 2020

(30) Foreign Application Priority Data

Oct. 24, 2018   (KR) .................. 10-2018-0127804
Nov. 8, 2018    (KR) .................. 10-2018-0136392

(51) Int. Cl.
*H01L 25/18*        (2006.01)
*H01L 23/00*        (2006.01)
(Continued)

(52) U.S. Cl.
CPC ............ *H01L 25/18* (2013.01); *H01L 21/563* (2013.01); *H01L 21/565* (2013.01);
(Continued)

(58) Field of Classification Search
CPC ..... H01L 25/18; H01L 21/563; H01L 21/565; H01L 23/3128; H01L 23/3736;
(Continued)

(56) References Cited

U.S. PATENT DOCUMENTS 8,981,554 B2    3/2015   Kim
10,056,267 B2   8/2018   Cheng et al.
(Continued)

FOREIGN PATENT DOCUMENTS

KR       10-1099577 B1       12/2011
KR       10-2014-0094081 A    7/2014
KR       10-2014-0135509 A   11/2014

*Primary Examiner* — Tong-Ho Kim
(74) *Attorney, Agent, or Firm* — Muir Patent Law, PLLC

(57) ABSTRACT

A semiconductor package includes a package substrate, a first semiconductor device arranged on the package substrate, at least one second semiconductor device on the first semiconductor device to partially cover the first semiconductor device from a top down view, a heat dissipating insulation layer coated on the first semiconductor device and the at least one second semiconductor device, a conductive heat dissipation structure arranged on the heat dissipating insulation layer on a portion of the first semiconductor device not covered by the second semiconductor device, and a molding layer on the package substrate to cover the first semiconductor device and the at least one second semiconductor device. The heat dissipating insulation layer is formed of an electrically insulating and thermally conductive material, and the conductive heat dissipation structure formed of an electrically and thermally conductive material.

22 Claims, 18 Drawing Sheets

(51) Int. Cl.
  *H01L 23/31*   (2006.01)
  *H01L 23/48*   (2006.01)
  *H01L 23/373*  (2006.01)
  *H01L 21/56*   (2006.01)

(52) U.S. Cl.
  CPC ...... *H01L 23/3128* (2013.01); *H01L 23/3736* (2013.01); *H01L 23/481* (2013.01); *H01L 24/09* (2013.01); *H01L 24/17* (2013.01); *H01L 24/32* (2013.01); *H01L 24/48* (2013.01); *H01L 24/73* (2013.01); *H01L 2224/0401* (2013.01); *H01L 2224/73253* (2013.01); *H01L 2224/73257* (2013.01); *H01L 2224/73265* (2013.01); *H01L 2924/1431* (2013.01); *H01L 2924/1434* (2013.01)

(58) Field of Classification Search
  CPC ....... H01L 23/481; H01L 24/09; H01L 24/17; H01L 24/32; H01L 24/48; H01L 24/73; H01L 2224/0401; H01L 2224/73253; H01L 2224/73257; H01L 2224/73265; H01L 2924/1431; H01L 2924/1434
  USPC ......................................................... 257/712
  See application file for complete search history.

(56) References Cited

U.S. PATENT DOCUMENTS

| | | |
|---|---|---|
| 10,056,351 B2 | 8/2018 | Yu et al. |
| 10,068,824 B2 | 9/2018 | Kim et al. |
| 2014/0340849 A1* | 11/2014 | Kim ................. H01L 25/50 361/717 |
| 2018/0247912 A1 | 8/2018 | Tseng et al. |

* cited by examiner

SEMICONDUCTOR PACKAGE AND METHOD OF MANUFACTURING SEMICONDUCTOR PACKAGE

PRIORITY STATEMENT

This application claims priority under 35 U.S.C. § 119 to Korean Patent Application No. 10-2018-0127804, filed on Oct. 24, 2018 and to Korean Patent Application No. 10-2018-0136392, filed on Nov. 8, 2018 in the Korean Intellectual Property Office (KIPO), the contents of each of which are herein incorporated by reference in their entirety.

BACKGROUND

1. Field

Example embodiments relate to a semiconductor package and a method of manufacturing the semiconductor package. More particularly, example embodiments relate to a system in package including various chips stacked in one package and a method of manufacturing the same.

2. Description of the Related Art

In a System In Package (SIP), a memory device may be affected by heat from a logic device. Thus, it may be important to provide a heat transfer path for dissipating heat from the logic device to the surrounding environment. Although a metal material has many advantages for heat transfer, there are restrictions to be used inside the package due to its electrical conductivity.

In related art, an adhesive member having high thermal conductivity such as heat slug may be used for dissipating heat. However, accordingly to these methods, it may be difficult to efficiently dissipate heat from the logic device to the surrounding environment. Further, an adhesive member including a metal material having high thermal conductivity may be limited to be formed on a surface of the device due to its electrical conductivity.

SUMMARY

Example embodiments provide a semiconductor package having an improved heat dissipation performance.

Example embodiments provide a method of manufacturing the semiconductor package.

According to example embodiments, a semiconductor package includes a package substrate, a first semiconductor device arranged on the package substrate, at least one second semiconductor device on the first semiconductor device to partially cover the first semiconductor device from a top down view, a heat dissipating insulation layer coated on the first semiconductor device and the at least one second semiconductor device, a conductive heat dissipation structure arranged on the heat dissipating insulation layer on a portion of the first semiconductor device not covered by the second semiconductor device, and a molding layer on the package substrate to cover the first semiconductor device and the at least one second semiconductor device. The heat dissipating insulation layer is formed of an electrically insulating and thermally conductive material, and the conductive heat dissipation structure formed of an electrically and thermally conductive material.

According to example embodiments which may be the same as or different embodiments from the above-described examples, an electronic device includes a substrate, a first electronic product arranged on the substrate, at least one second electronic product on the first electronic product to partially cover the first electronic product from a top-down view, a heat dissipating insulation layer coated on at least top surfaces of the substrate and the first and second electronic products, a first conductive heat dissipation member arranged on the heat dissipating insulation layer on a portion of the first electronic product not covered by the second electronic product, and a molding member on the substrate to cover the first and second electronic products. The heat dissipating insulation layer is formed of an electrically insulating and thermally conductive material and the first conductive heat dissipation member is formed of an electrically and thermally conductive material. The electronic device may be a semiconductor package, for example, and the first electronic product and at the least one second electronic product may each be a semiconductor device.

According to example embodiments, which may be the same as or different embodiments from the above-described examples, an electronic device includes a substrate, a first electronic product arranged on the substrate, at least one second electronic product on the first electronic product to partially cover the first electronic product from a top-down view, the second electronic product configured to consume a power less than the first electronic product, a heat dissipating insulation layer coated on the substrate, the first electronic product, and the at least one second electronic product, the heat dissipating insulation layer formed of an electrically insulating material, a first conductive heat dissipation member arranged on the heat dissipating insulation layer on a portion of the first electronic product not covered by the second electronic product, the first conductive heat dissipating member formed of an electrically conductive material, and a molding member on the substrate to cover the first electronic product and the at least one second electronic product.

According to example embodiments, in a method of manufacturing a semiconductor package, a first semiconductor device is stacked on a package substrate. At least one second semiconductor device is stacked on the first semiconductor device to partially cover the first semiconductor device from a top-down view. A heat dissipating insulation layer is coated on the first and second semiconductor devices. A first conductive heat dissipation member is formed on the heat dissipating insulation layer on a portion of the first semiconductor device not covered by the second semiconductor device. A molding member is formed on the package substrate to cover the first and second semiconductor devices.

Accordingly, heat from the first semiconductor device consuming a relatively higher power may be dissipated quickly in a vertical direction through the conductive heat dissipation member having high thermal conductivity. Thus, heat dissipation performance of a system in package may be improved.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is a plan view illustrating the semiconductor package in FIG. 1.

FIGS. 3 to 7 are cross-sectional views illustrating a method of manufacturing a semiconductor package in accordance with example embodiments.

FIG. 8 is a cross-sectional view illustrating a semiconductor package in accordance with example embodiments.

FIGS. 9 to 11 are cross-sectional views illustrating a method of manufacturing a semiconductor package in accordance with example embodiments.

FIG. 12 is a cross-sectional view illustrating a semiconductor package in accordance with example embodiments.

FIG. 13 is a cross-sectional view illustrating a semiconductor package in accordance with example embodiments.

FIG. 14 is a perspective view illustrating the semiconductor package in FIG. 13.

FIGS. 15 to 20 are cross-sectional views illustrating a method of manufacturing a semiconductor package in accordance with example embodiments.

FIG. 21 is a cross-sectional view illustrating a semiconductor package in accordance with example embodiments.

FIGS. 22 to 24 are cross-sectional views illustrating a method of manufacturing a semiconductor package in accordance with example embodiments.

FIG. 25 is a cross-sectional view illustrating a semiconductor package in accordance with example embodiments.

FIGS. 26 and 27 are cross-sectional views illustrating a method of manufacturing a semiconductor package in accordance with example embodiments.

FIG. 28 is a cross-sectional view illustrating a semiconductor package in accordance with example embodiments.

FIG. 29 is a cross-sectional view illustrating a semiconductor package in accordance with example embodiments.

FIG. 30 is a cross-sectional view illustrating a semiconductor package in accordance with example embodiments.

FIG. 31 is a cross-sectional view illustrating a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
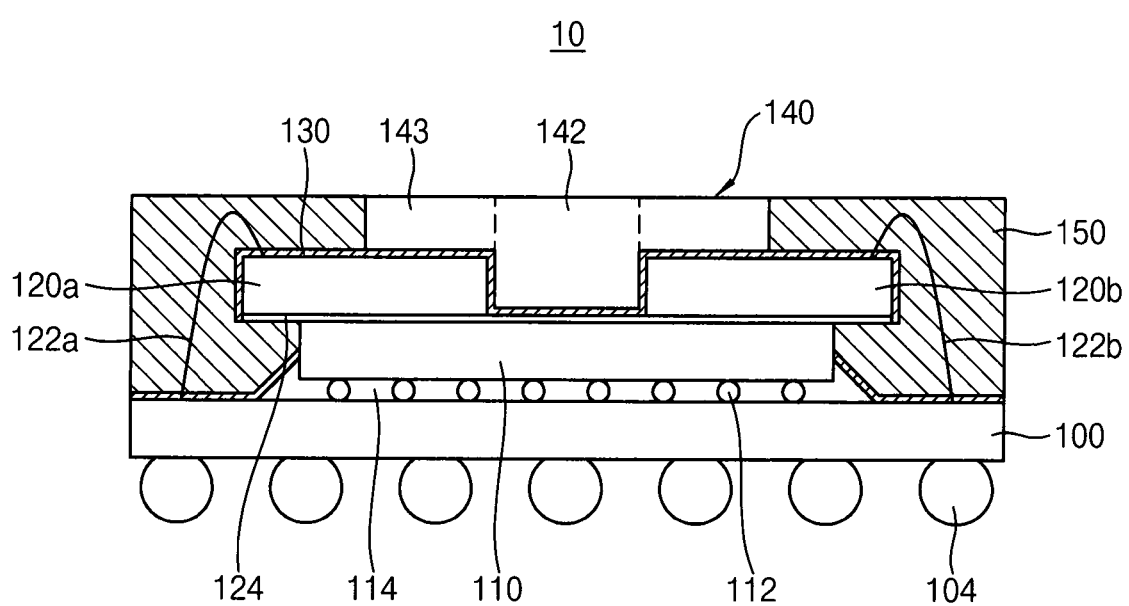
FIGS. 1 to 31 represent non-limiting, example embodiments as described herein.
Figure 2:
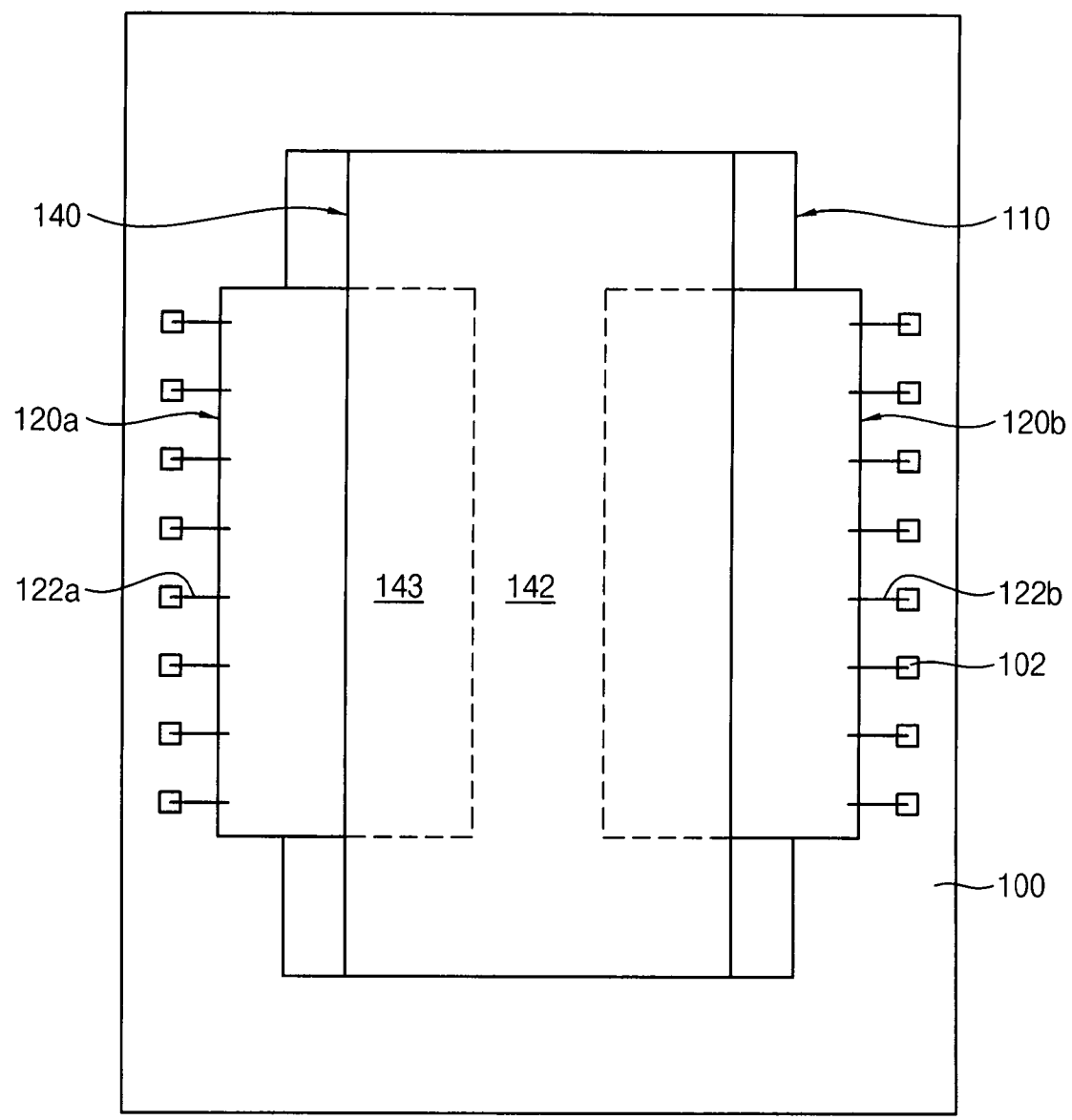

FIG. 1 is a cross-sectional view illustrating a semiconductor package in accordance with example embodiments. FIG. 2 is a plan view illustrating the semiconductor package in FIG. 1.

Referring to FIGS. 1 and 2, a semiconductor package 10 may include a package substrate 100, a first semiconductor device 110, at least one second semiconductor device 120a, 120b, a heat dissipating insulation layer 130, a conductive heat dissipation member 140, and a molding member 150. Additionally, the semiconductor package 10 may be an electronic device such as System In Package (SIP). The first semiconductor device 110 may include a first electronic product such as logic semiconductor device, and the second semiconductor device 120a, 120b may include a second electronic product such as memory device. The first electronic product may be a first heat source consuming a first power, and the second electronic product may be a second heat source consuming a second power lower than the first power. Accordingly, the first semiconductor device 110 may dissipate greater heat than the second semiconductor device 120a, 120b.

The package substrate 100 may be a substrate having an upper surface and a lower surface opposite to each other. For example, the package substrate 100 may be a printed circuit board (PCB). The printed circuit board may include a multi circuit board having vias and various circuit elements therein. A semiconductor package, as described herein, refers to one or more semiconductor chips mounted on a package substrate, where the semiconductor chips and package substrate are covered or surrounded by a molding layer, or encapsulation layer. A semiconductor package is different from a memory module, which typically includes a plurality of memory devices, such as semiconductor packages, separately mounted on one or both sides of a module board, which memory devices and module board are not covered with an encapsulation layer. A memory module typically has a different structure and different circuitry from a semiconductor package.

The first semiconductor device 110 may be stacked on the package substrate 100. The first semiconductor device 110 may be mounted on the package substrate 100, for example in a flip chip bonding manner. The first semiconductor device 110 may be formed of a semiconductor chip separated from a semiconductor wafer, or a plurality of stacked semiconductor chips separated from wafers and then mounted on each other, or separated from a group of stacked semiconductor wafers. In one embodiment, the first semiconductor device 110 may be electrically connected to the package substrate 100 via conductive bumps 112.

A plurality of the conductive bumps 112 may be arranged on a plurality of substrate pads on the upper surface of the package substrate 100 to electrically connect the first semiconductor device 110 and the package substrate 100 to each other. An adhesive member 114 may be underfilled between the first semiconductor device 110 and the package substrate 100. The adhesive member 114 may include an epoxy material filling between the first semiconductor device 110 and the package substrate 100. The adhesive member 114 may more generally be described as an underfill, or underfill layer.

Alternatively, the first semiconductor device 110 may be electrically connected to the package substrate 100 by bonding wires. In this case, the first semiconductor device 110 may be stacked on the package substrate 100 via an adhesive layer. Items being described herein as electrically connected are communicatively connected via electrically conductive or semi-conductive components, such that electrical signals can pass from one component to another for use or further transmission. Therefore, an electrically conductive component connected to an electrically insulative component that blocks an electrical signal from further transmission and does not use the electrical signal is not electrically connected to that electrically insulative component.

In example embodiments, the at least one second semiconductor device 120a, 120b may be stacked on the first semiconductor device 110 to partially cover the first semiconductor device 110 (e.g., to partially overlap from a top-down view). Each second semiconductor device 120a, and 120b may overlap partially with the first semiconductor device 110. A portion of an upper surface of the first semiconductor device 110 may be not covered by one or both of the second semiconductor devices 120a, 120b, and therefore may be exposed in relation to one or both of second semiconductor devices 120a, 120b.

In particular, two second semiconductor devices 120a, 120b may be stacked on the first semiconductor device 110. The second semiconductor devices 120a, 120b may be arranged on the first semiconductor device 110 to be spaced apart from each other. The second semiconductor devices 120a, 120b may be stacked on the first semiconductor device 110 via an adhesive layer 124. The adhesive layer 124 may include, for example, a polymer material having excellent thermal conductivity in relation to other adhesive materials. Examples of the polymer material may be a thermally conductive adhesive tape, a thermally conductive grease, a thermally conductive adhesive, etc. The adhesive layer 124 may have a thermal conductivity, for example, of 10 watts per meter-kelvin (W/(m·K)) or greater. The second semiconductor devices 120*a*, 120*b* may be electrically connected to the package substrate 100 by bonding wires 122*a*, 122*b*.

The second semiconductor devices 120*a*, 120*b* may include a memory device such as DRAM, NAND flash memory, etc. The second semiconductor devices may each include a plurality of stacked semiconductor chips. The number, sizes, locations, etc. of the stacked chips are exemplarily illustrated, and thus, they are not limited to the examples described above.

In example embodiments, the heat dissipating insulation layer 130 may be coated on the first and second semiconductor devices 110, 120*a*, 120*b*. The heat dissipating insulation layer 130 may be deposited conformally on the exposed entire surfaces of the package substrate 100 and the first and second semiconductor devices 110, 120*a*, 120*b*. Accordingly, the upper surface of the package substrate 100, a sidewall of the first semiconductor device 110, and upper surfaces and sidewalls of the second semiconductor devices 120*a*, 120*b* may be covered by the heat dissipating insulation layer 130. As such, the heat dissipating insulation layer 130 may be deposited conformally on at least the exposed entire upper surfaces of the first and second semiconductor devices 110, 120*a*, 120*b*

The heat dissipating insulation layer 130 may include an electrically insulating insulation material having excellent thermal conductivity in relation to typical electrically insulating materials. The heat dissipating insulation layer 130 may include, for example, aluminum oxide ($Al_2O_3$), boron nitride (BN), aluminum nitride (AlN), ceramic coated metal balls, etc. Materials described herein as thermally conductive include materials that readily transfer heat. Materials with opposite heat transfer properties from thermally conductive materials, which tend to prevent heat transfer, may be described as thermally insulative. As an example, the heat dissipating insulation layer 130 may include material with thermal conductivity of 10 watts per meter-kelvin (W/(m·K)) or greater, and in some embodiments 30 watts per meter-kelvin (W/(m·K)) or greater.

In example embodiments, the conductive heat dissipation member 140 may include a first conductive heat dissipation member 142 disposed on the heat dissipating insulation layer 130 on the first semiconductor device 110 exposed by the second semiconductor device 120*a*, 120*b*. Additionally, the conductive heat dissipation member 140 may further include a second conductive heat dissipation member 143 disposed on the heat dissipating insulation layer 130 on the second semiconductor device 120*a*, 120*b*. The first conductive heat dissipation member 142 and second conductive heat dissipation member 143 may each be solid structures and may be continuously formed of a single integral structure extending along a length of the first semiconductor device 110 and second semiconductor devices 120*a* and 120*b* in a first direction. The conductive heat dissipation member 140 may be described as an electrically conductive heat dissipation layer, or as an electrically conductive heat dissipation structure that includes first and second (or more) portions.

The conductive heat dissipation member 140 may include an electrically and thermally conductive material having excellent thermal conductivity such as a metal such as gold (Au), silver (Ag), copper (Cu), etc., graphite, graphene, etc.

As an example, the conductive heat dissipation member 140 may include material with thermal conductivity above 50 watts per meter-kelvin (W/(m·K)) and in some embodiments above 100 watts per meter-kelvin (W/(m·K)). As shown in the example of FIG. 2, the conductive heat dissipation member 140 may extend continuously to have a length greater than each of the second semiconductor devices 120*a*, 120*b*. The length may be at least greater than a distance spanned by three adjacent pads 102 (e.g., bonding pads) formed on the package substrate. In some embodiments, the conductive heat dissipation member 140 is electrically insulated from any circuitry of the first semiconductor chip 110, the second semiconductor chips 120*a*, 120*b*, and the package substrate 100, and does not transfer electrical signals to or from the first semiconductor chip 110, the second semiconductor chips 120*a*, 120*b*, or the package substrate 100.

The first conductive heat dissipation member 142 may have a pillar shape extending in a vertical direction from the surface of the heat dissipating insulation layer 130 between the second semiconductor devices 120*a*, 120*b*. The first conductive heat dissipation member 142 may contact the heat dissipating insulation layer 130 on the sidewalls of the second semiconductor devices 120*a*, 120*b*, as well as the heat dissipating insulation layer 130 on a top surface of the package substrate 100. Alternatively, the first conductive heat dissipation member 142 may be arranged to be spaced apart from the heat dissipating insulation layer 130 on the sidewalls of the second semiconductor devices 120*a*, 120*b*, such that it does not contact the sidewalls of the second semiconductor devices 120*a*, 120*b*. It will be understood that when an element is referred to as being "connected" or "coupled" to or "on" another element or "between" two elements, it can be directly connected or coupled to or on or between the other element(s) or intervening elements may be present. In contrast, when an element is referred to as being "directly connected" or "directly coupled" or "directly on" another element, or as "directly between" two elements, there are no intervening elements present. Other words used to describe the relationship between elements should be interpreted in a like fashion (e.g., "adjacent" versus "directly adjacent," etc.). The term "contact," as used herein, refers to a direction connection (i.e., touching) unless the context indicates otherwise.

The second conductive heat dissipation member 143 may extend laterally on the heat dissipating insulation layer 130 on the second semiconductor devices 120*a*, 120*b*. The second conductive heat dissipation member 143 may contact or may be integrally formed with the first conductive heat dissipation member 142. Alternatively, the second conductive heat dissipation member 143 may be arranged to be spaced apart from a sidewall of the first conductive heat dissipation member 142.

As mentioned above, the second conductive heat dissipation member 143 may be formed integrally with the first conductive heat dissipation member 142. A top-surface of the second conductive heat dissipation member 143 may have a height the same as a height of a top surface of the first conductive heat dissipation member 142 with respect to the package substrate 100.

In example embodiments, the molding member 150, also described as a molding layer, may be formed on the package substrate 100 to cover at least a portion of the first and second semiconductor devices 110, 120*a*, 120*b*, to thereby protect the first and second semiconductor devices 110, 120*a*, 120*b* from the surrounding environment. The molding member 150 may be formed to expose upper surfaces of the first and second conductive heat dissipation members 142, 143, for example to an outside of the semiconductor package 10. The molding member 150 may have a top surface at a height the same as heights of the top surfaces of first and second conductive heat dissipation members 142, 143, with respect to a top surface of the package substrate 100.

As mentioned above, the semiconductor package 10 may include the first conductive heat dissipation member 142 thermally connected to the first semiconductor device 110 to dissipate heat from the first semiconductor device 110 to the surrounding environment. The semiconductor package 10 may include the second conductive heat dissipation member 143 thermally connected to the second semiconductor device 120a, 120b to dissipate heat from the second semiconductor device 120a, 120b to the surrounding environment.

The heat from the first semiconductor device 110 may be dissipated through the heat dissipating insulation layer 130 and the first conductive heat dissipation member 142. The heat from the second semiconductor device 120a, 120b may be dissipated through the heat dissipating insulation layer 130 and the second conductive heat dissipation member 143. The first and second conductive heat dissipation members 142, 143 may serve as a heat transfer path for dissipating heat from the first and second semiconductor devices 110, 120a, 120b to the surrounding environment.

Accordingly, the heat from the first semiconductor device 110 consuming a relatively higher power may be dissipated quickly in the vertical direction through the first conductive heat dissipation member 142 having high thermal conductivity. Thus, heat dissipation performance of the system in package may be improved.

Hereinafter, an example method of manufacturing the semiconductor package in FIGS. 1 and 2 will be explained.

FIGS. 3 to 7 are cross-sectional views illustrating a method of manufacturing a semiconductor package in accordance with example embodiments.

Figure 3:
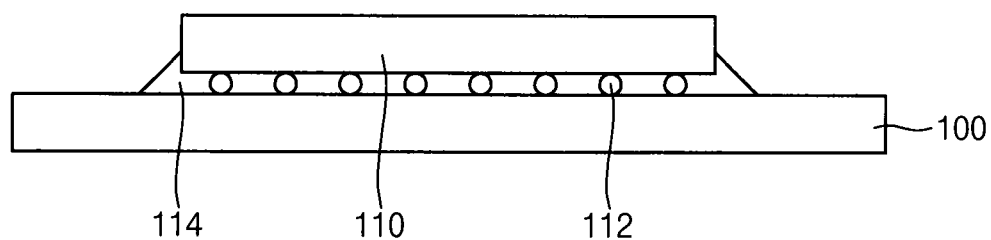
Figure 4:
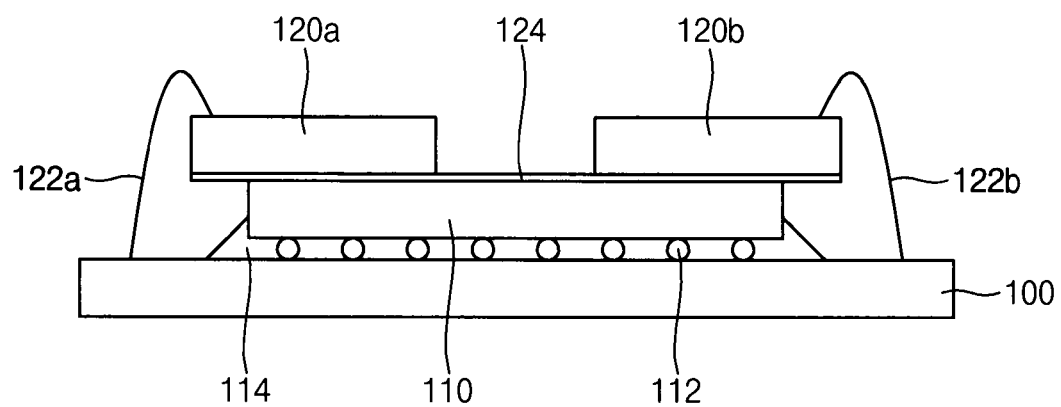

Referring to FIGS. 3 and 4, a first semiconductor device 110 may be stacked on a package substrate 100, and at least one second semiconductor device 120a, 120b may be stacked on the first semiconductor device 110 to partially cover the first semiconductor device 110.

First, the first semiconductor device 110 may be stacked on an upper surface of the package substrate 100. For example, the package substrate 110 may include a printed circuit board (PCB), an organic substrate, a ceramic substrate, a module board, etc.

The first semiconductor device 110 may be stacked on the package substrate 100. In some embodiments, the first semiconductor device 110 may be mounted on the package substrate 100 in a flip chip bonding manner. For example, the first semiconductor device 110 may be electrically connected to the package substrate 100 via conductive bumps 112. A plurality of the conductive bumps 112 may be arranged on a plurality of substrate pads on the upper surface of the package substrate 100 to electrically connect the first semiconductor device 110 and the package substrate 100 to each other.

After the first semiconductor device 110 is adhered on the package substrate 100, an adhesive member 114 may be underfilled between the first semiconductor device 110 and the package substrate 100. The adhesive member 114 may include, for example, an epoxy material filling between the first semiconductor device 110 and the package substrate 100.

The two second semiconductor devices 120a and 120b may be stacked on the first semiconductor device 110 to partially cover the first semiconductor device 110. The second semiconductor devices 120a, 120b may partially overlap the first semiconductor device 110. A portion of an upper surface of the first semiconductor device 110 may be exposed by the second semiconductor devices 120a, 120b.

The second semiconductor devices 120a, 120b may be arranged on the first semiconductor device 110 to be spaced apart from each other, therefore may have a gap or space formed therebetween. The second semiconductor devices 120a, 120b may be stacked on the first semiconductor device 110 via an adhesive layer 124. The adhesive layer 124 may include a polymer material having excellent thermal conductivity. Examples of the polymer material may be a thermal conductive adhesive tape, a thermal conductive grease, a thermal conductive adhesive, etc.

A wire bonding process may be performed to electrically connect chip pads of the second semiconductor devices 120a, 120b to the substrate pads of the package substrate 100. The chip pads of the second semiconductor devices 120a, 120b may be electrically connected to the substrate pads of the package substrate 100 by bonding wires 122a, 122b.

Figure 5:
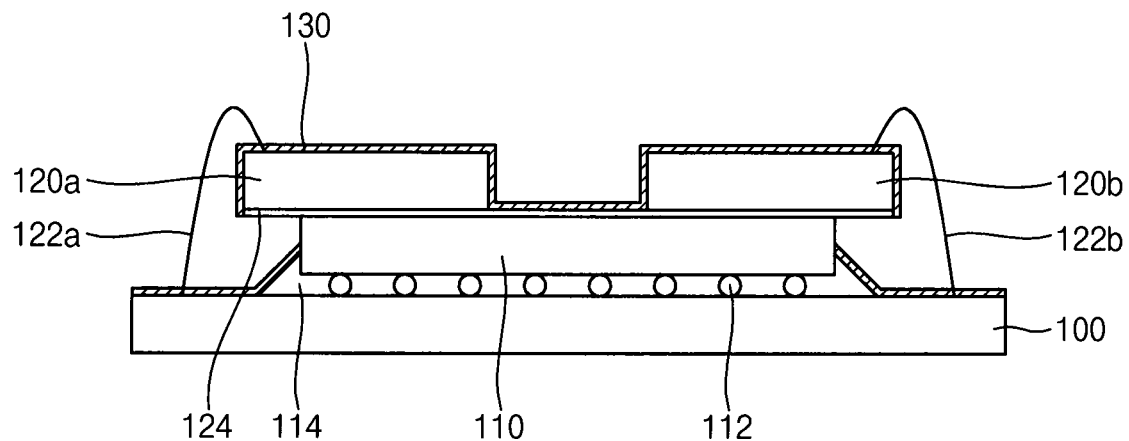
Figure 6:
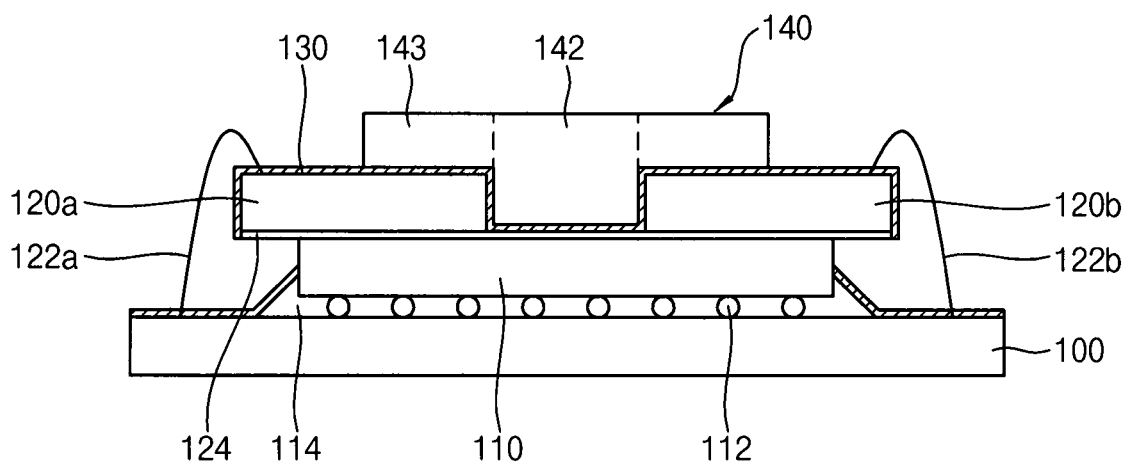

Referring to FIGS. 5 and 6, a heat dissipating insulation layer 130 may be coated on the first and second semiconductor devices 110, 120a, 120b, and a first conductive heat dissipation member 142 may be formed the heat dissipating insulation layer 130 over the first semiconductor device 110 exposed by the second semiconductor devices 120a, 120b. A second conductive heat dissipation member 143 may be formed on the heat dissipating insulation layer 130 over the second semiconductor devices 120a, 120b.

In example embodiments, the heat dissipating insulation layer 130 may be coated conformally on the entire exposed surfaces (e.g., side and upper surfaces) of the package substrate 100 and the first and second semiconductor devices 110, 120a, 120b, for example by a spray coating process. An electrically insulating insulation material may be sprayed out on the entire exposed surfaces of the package substrate 100 and the first and second semiconductor devices 110, 120a, 120b, for example using a spray nozzle to form the heat dissipating insulation layer 130 having a uniform thickness.

The electrically insulating insulation material may have excellent thermal conductivity with respect to typical electrically insulating materials. The heat dissipating insulation layer 130 may include, for example, aluminum oxide ($Al_2O_3$), boron nitride (BN), aluminum nitride (AlN), ceramic coated metal balls, etc.

Then, the first conductive heat dissipation member 142 may be formed by a dispensing process, a screen printing process, etc. For example, a metal paste may be dispensed on the heat dissipating insulation layer 130 over the first semiconductor device 110 exposed by the second semiconductor device 120a, 120b to form the first conductive heat dissipation member 142. In the dispensing process, the metal paste may be dispensed on the heat dissipating insulation layer 130 over the second semiconductor devices 120a, 120b to form the second conductive heat dissipation member 143.

The metal paste may be dispensed repeatedly using a dispenser to form the first and second conductive heat dissipation members 142, 143 having a desired shape to desired location. The metal paste may include, for example, a conductive material having excellent thermal conductivity such as a metal such as gold (Au), silver (Ag), copper (Cu), etc.

The first conductive heat dissipation member 142 may be formed to have a pillar shape extending in a vertical direction from the surface of the heat dissipating insulation layer 130 between the second semiconductor devices 120a, 120b. The first conductive heat dissipation member 142 may contact the heat dissipating insulation layer 130 on sidewalls of the second semiconductor devices 120a, 120b. Alternatively, the first conductive heat dissipation member 142 may be arranged to be spaced apart from the heat dissipating insulation layer 130 on the sidewalls of the second semiconductor devices 120a, 120b.

The second conductive heat dissipation member 143 may be formed integrally with the first conductive heat dissipation member 142. The second conductive heat dissipation member 143 may have a top surface height with respect to a top surface of the package substrate 100 the same as a top surface height of the first conductive heat dissipation member 142.

Figure 7:
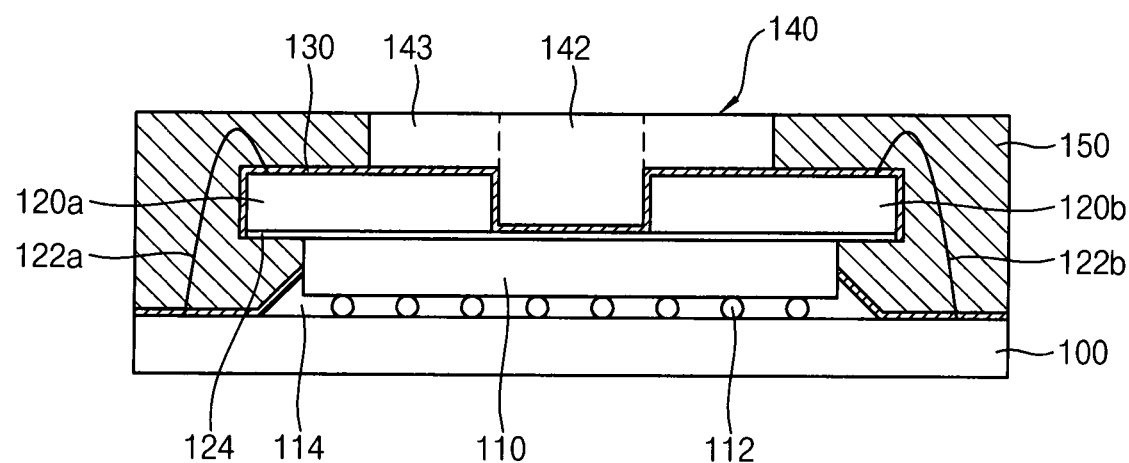

Referring to FIG. 7, a molding member 150 may be formed on the package substrate 100 to cover at least a portion of the first and second semiconductor devices 110, 120a, 120b. The molding member 150 may be an encapsulation structure formed to expose upper surfaces of the first and second conductive heat dissipation members 142, 143 for example to an outside of the semiconductor package. An insulation material such as epoxy molding compound (EMC) may be coated on the upper surface of the package substrate 100, and the coated insulation material may be grinded to expose the upper surfaces of the first and second conductive heat dissipation members 142, 143, and to make them have top surfaces that are coplanar with the top surface of the molding member 150. Therefore molding member 150 may have a top surface height the same as heights of the first and second conductive heat dissipation members 142, 143 with respect to a top surface of the package substrate 100.

Then, external connection terminals 104 may be formed on outer connection pads on a lower surface of the package substrate 100 to complete a semiconductor package 10.

Figure 8:
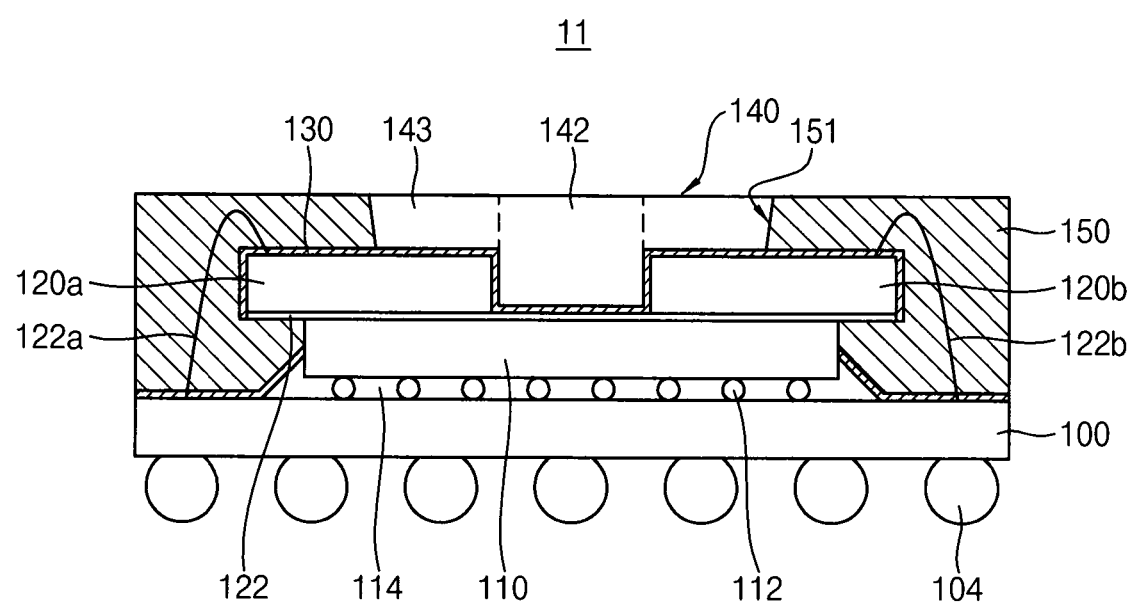

FIG. 8 is a cross-sectional view illustrating a semiconductor package in accordance with example embodiments. The semiconductor package may be substantially the same as or similar to the semiconductor package described with reference to FIG. 1 except for a conductive heat dissipation member. Thus, same reference numerals will be used to refer to the same or like elements and any further repetitive explanation concerning the above elements will be omitted.

Referring to FIG. 8, a conductive heat dissipation member 140 of a semiconductor package 11 may include a first conductive heat dissipation member 142 arranged on a heat dissipating insulation layer 130 over a first semiconductor device 110 exposed by second semiconductor devices 120a, 120b and second conductive heat dissipation members 143 arranged on the heat dissipation insulation layer 130 over the second semiconductor devices 120a, 120b.

In example embodiments, a molding member 150 may have a through hole 151 formed therein to expose an upper surface of the heat dissipating insulation layer 130 over the first semiconductor device 110 and the second semiconductor devices 120a, 120b. The conductive heat dissipation member 140 may be filled within the through hole 151.

A width of the through hole 151 may be decreased gradually toward a lower portion of the through hole 151, particularly for a portion above second semiconductor devices 120a and 120b. Accordingly, the width of the through hole 151 may be increased gradually toward an upper portion of the through hole 151. This is different from the embodiment of FIG. 7, in which a width of the through hole in the molding member 150 at a height above the second semiconductor devices 120a and 120b is uniform from bottom to top.

Hereinafter, a method of manufacturing the semiconductor package in FIG. 8 will be explained.

Figure 9:
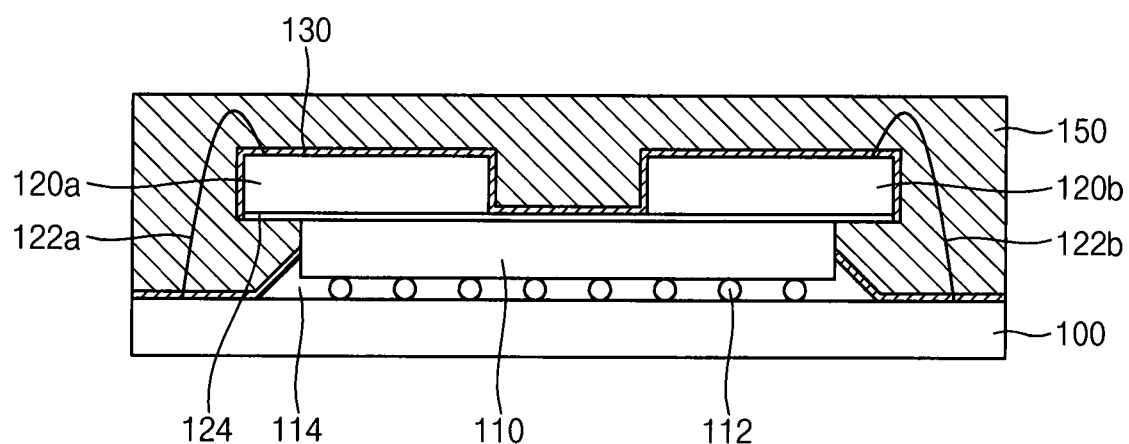
Figure 10:
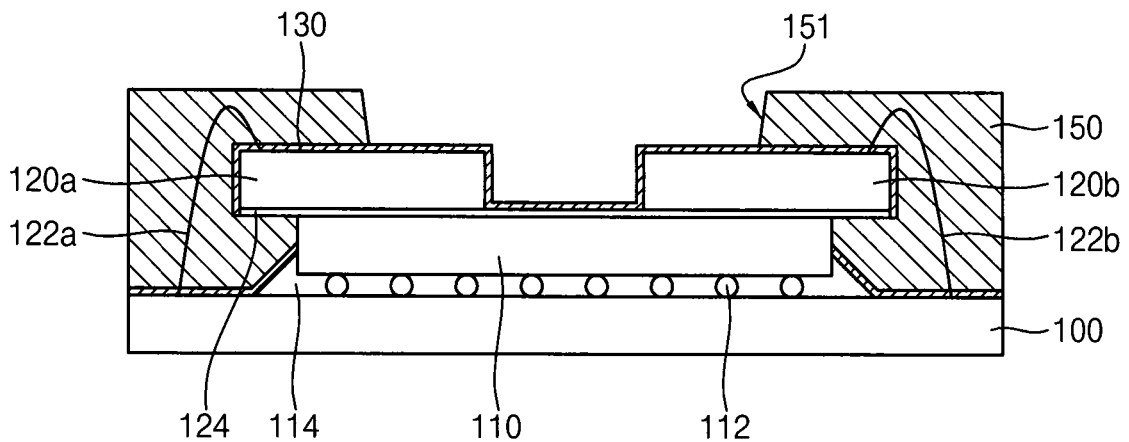
Figure 11:
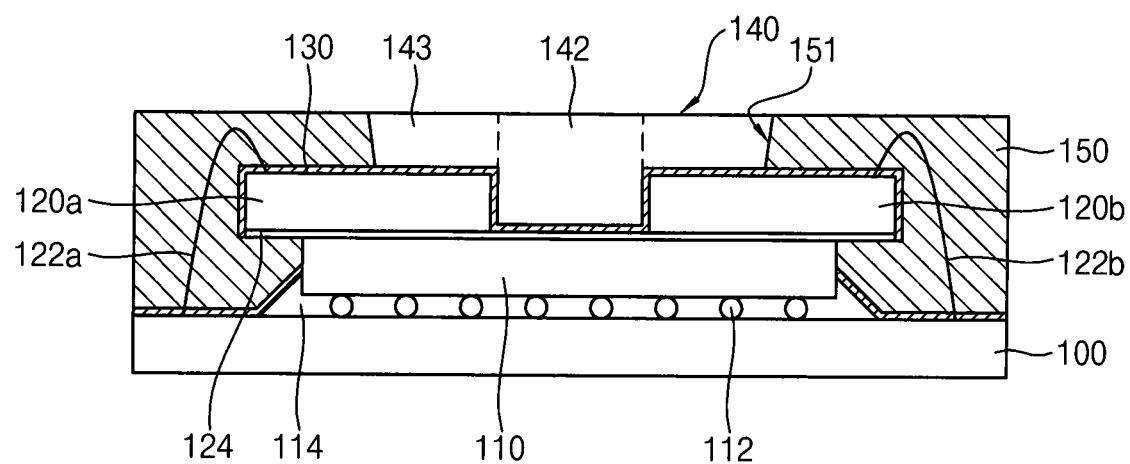

FIGS. 9 to 11 are cross-sectional views illustrating a method of manufacturing a semiconductor package in accordance with example embodiments.

Referring to FIG. 9, first, processes the same as processes as described with reference to FIGS. 3 to 5 may be performed such that a heat dissipating insulation layer 130 is coated on first and second semiconductor devices 110, 120a, 120b on a package substrate 100 and a molding member 150 is formed on an upper surface of the package substrate 100 to cover the first and second semiconductor devices 110, 120a, 120b.

Referring to FIGS. 10 and 11, a conductive heat dissipation member 140 may be formed in the molding member 150 to extend in a vertical direction from the heat dissipating insulation layer 130 on the first and second semiconductor devices 110, 120a, 120b.

First, the molding member 150 may be formed to cover the entire surface of the heat dissipating insulation layer 130 and then may be partially removed to form a through hole 151 which exposes a portion of an upper surface of the heat dissipating insulation layer 130. For example, the through hole 151 may be formed by an etching process, a laser drilling process, etc.

Then, the through hole 151 of the molding member 150 may be filled up with an electrically conductive material to form the conductive heat dissipation member 140 which contacts the heat dissipating insulation layer 130. The conductive material may be a metal paste including a metal material such as gold (Au), silver (Ag), copper (Cu), etc. The conductive heat dissipation member 140 may be formed such that an upper surface of the conductive heat dissipation member 140 is exposed from the molding member 150.

The conductive heat dissipation member 140 may include a first conductive heat dissipation member 142 disposed on the heat dissipating insulation layer 130 over the first semiconductor device 110 exposed by the second semiconductor device 120a, 120b and a second conductive heat dissipation member 143 disposed on the heat dissipating insulation layer 130 on the second semiconductor device 120a, 120b.

Figure 12:
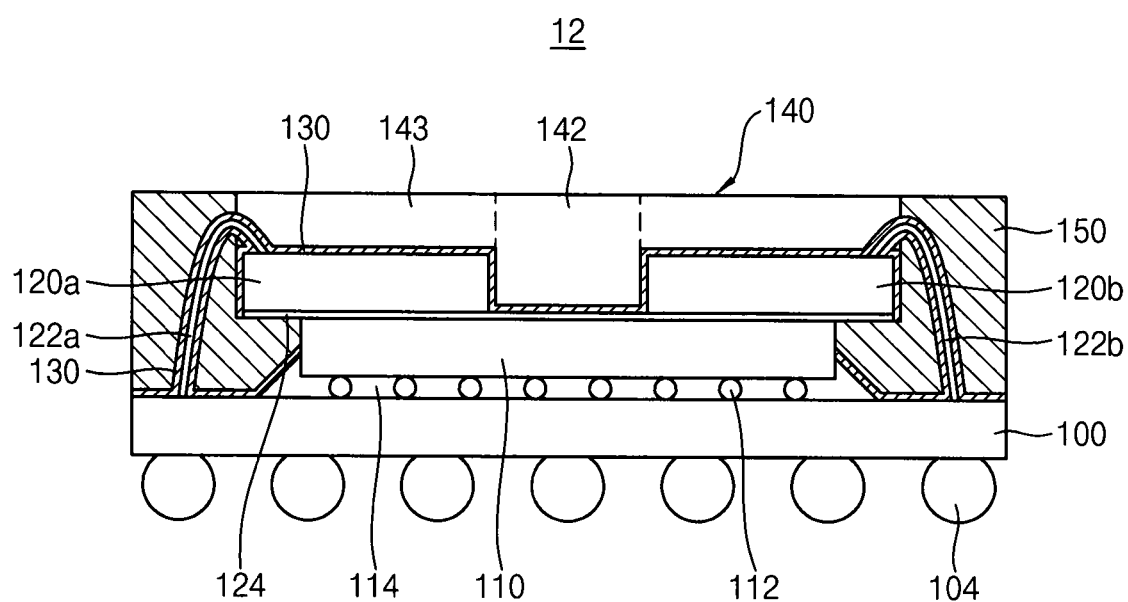

FIG. 12 is a cross-sectional view illustrating a semiconductor package in accordance with example embodiments. The semiconductor package may be substantially the same as or similar to the semiconductor package described with reference to FIG. 1 except for a conductive heat dissipation member and heat dissipating insulation layer. Thus, same reference numerals will be used to refer to the same or like elements and any further repetitive explanation concerning the above elements will be omitted.

Referring to FIG. 12, a conductive heat dissipation member 140 of a semiconductor package 12 may include a first conductive heat dissipation member 142 disposed on a heat dissipating insulation layer 130 over the first semiconductor device 110 exposed by a second semiconductor device 120a, 120b and a second conductive heat dissipation member 143 disposed on the heat dissipating insulation layer 130 over the second semiconductor device 120a, 120b.

In example embodiments, the heat dissipating insulation layer 130 may cover bonding wires 122a, 122b on the second semiconductor devices 120a, 120b. The second conductive heat dissipation member 143 may extend laterally to cover the entire upper surfaces of the second semiconductor devices 120a, 120b. The second conductive heat dissipation member 143 may extend to a region where the bonding wires extend over the second semiconductor devices 120a, 120b. The heat dissipating insulation layer 130 may be interposed between the bonding wires 122a, 122b and the second conductive heat dissipation member 143.

When an insulation material is sprayed out onto the entire exposed surface of a package substrate 100 using a spray nozzle to form the heat dissipating insulation layer 130, the insulation material may cover surfaces of the bonding wires 122a, 122b on the second semiconductor devices 120a, 120b. Though not shown in connection with FIG. 1, this same coating may be included in the embodiment of FIG. 1 to cover surfaces of the bonding wires 122a and 122b. Accordingly, the bonding wires 122a, 122b may be coated with the heat dissipating insulation layer 130.

Accordingly, in the embodiment of FIG. 12, since the bonding wires 122a, 122b are electrically insulated by the heat dissipating insulation layer 130, the second conductive heat dissipation member 143 may be formed on a relatively larger area to a desired location. Thus, heat dissipation performance of the system in package may be improved.

Figure 13:
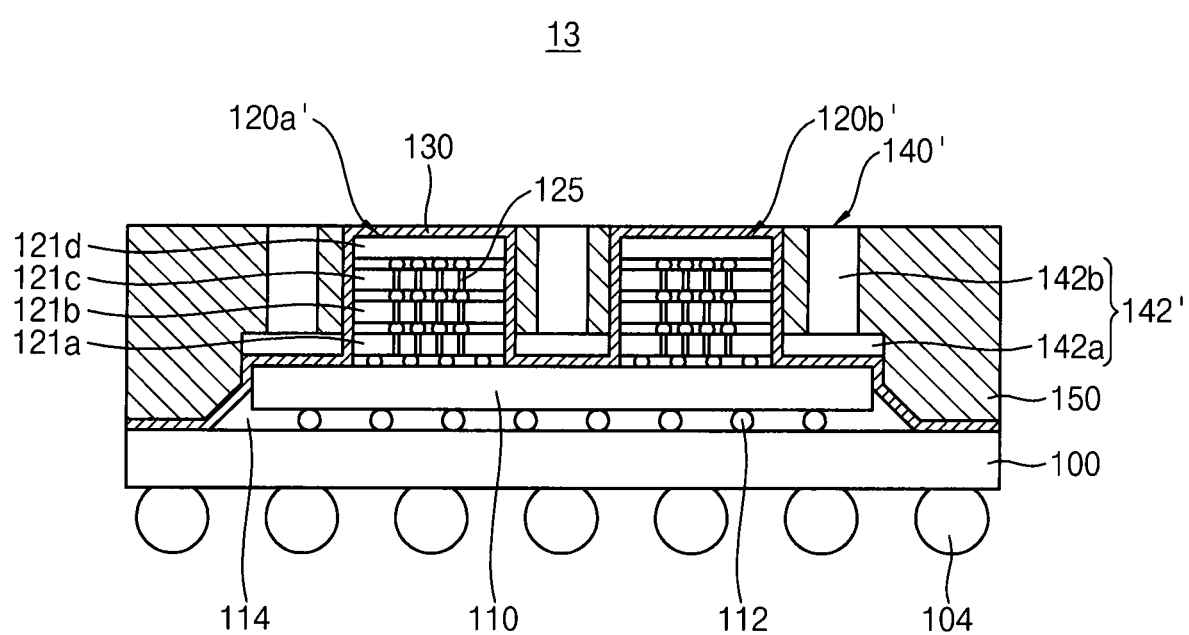
Figure 14:
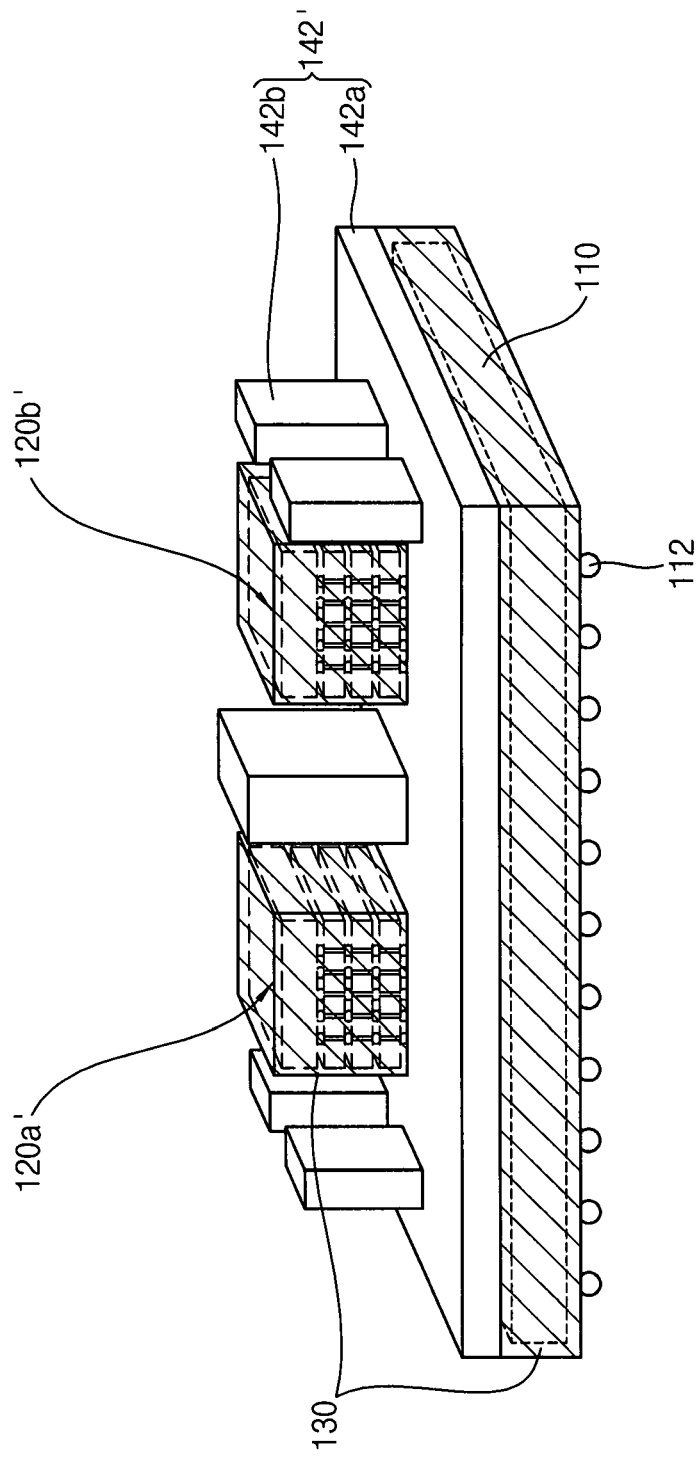

FIG. 13 is a cross-sectional view illustrating a semiconductor package in accordance with example embodiments. FIG. 14 is a perspective view illustrating the semiconductor package in FIG. 13. The semiconductor package may be substantially the same as or similar to the semiconductor package described with reference to FIG. 1 except for the second semiconductor devices and the conductive heat dissipation member. Thus, the same reference numerals will be used to refer to the same or like elements and any further repetitive explanation concerning the above elements may be omitted.

Referring to FIGS. 13 and 14, second semiconductor devices 120a', 120b' of a semiconductor package 13 may each include a plurality of stacked semiconductor chips. Each second semiconductor device may include, for example, a high bandwidth memory (HBM) device.

In example embodiments, two second semiconductor devices 120a', 120b' may be arranged on a first semiconductor device 110 to be spaced apart from each other. The second semiconductor device 120a', 120b' may each include a buffer die 121a and first to third memory dies 121b, 121c, 121d sequentially stacked on one another. The buffer die 121a and the first to third memory dies 121b, 121c, 121d may be electrically connected to each other by TSVs (through substrate vias) 125, which may be through silicon vias. The buffer die 121a and the first to third memory dies 121b, 121c, 121d may communicate data signals and control signals with each other through the TSVs 125. The buffer die 121a may be electrically connected to the first semiconductor device 110 by a plurality of conductive bumps 123. A second semiconductor device as the HBM device including four stacked dies (chips) is exemplarily illustrated, however, it may not be limited thereto.

A heat dissipating insulation layer 130 may be coated conformally on the entire exposed surfaces of a package substrate 100 and the first and second semiconductor devices 110, 120a', 120b'. Accordingly, the heat dissipating insulation layer 130 may be coated on an upper surface of the package substrate 100, a sidewall of the first semiconductor device 110, and upper surface and sidewalls of the second semiconductor devices 120a', 120b'.

In example embodiments, a conductive heat dissipation member 140' may include a first conductive heat dissipation member 142' disposed on the heat dissipating insulation layer 130 on the first semiconductor device 110 exposed by the second semiconductor device 120a', 120b'. The first conductive heat dissipation member 142' may include a conductive plate 142a (e.g., formed of an electrically and thermally conductive material) on the heat dissipating insulation layer 130 on the first semiconductor device 110 to extend laterally and surround the second semiconductor device 120a', 120b' and at least one conductive pillar 142b (e.g., formed of an electrically and thermally conductive material) extending in a vertical direction from the conductive plate 142a. The conductive plate 142a may have a greater width in a first, horizontal direction than height in a second, vertical direction, and each conductive pillar may have a greater height in a second, vertical direction than width in at least a first, horizontal direction. The conductive plate 142a may extend continuously in a horizontal direction to have a length greater than each of the second semiconductor devices 120a', 120b'. Each conductive pillar 142b may extend continuously in a horizontal direction by a length at least greater than a distance spanned by two adjacent pads TSVs formed in the second semiconductor devices 120a' or 120b'.

The conductive plate 142a may be spaced apart from the heat dissipating insulation layer 130 on sidewalls of the second semiconductor devices 120a', 120b' (e.g., with portions of the molding member 150 therebetween). Alternatively, the conductive plate 142a may contact with heat dissipating insulation layer 130 on the sidewalls of the second semiconductor devices 120a', 120b', with no portion of the molding member 150 therebetween.

The conductive pillar 142b may extend to a height the same as heights of the second semiconductor devices 120a', 120b', with respect to a top surface of the package substrate 100, and therefore top surfaces of the conductive pillars 142b may be coplanar with top surfaces of the semiconductor devices 120a', 120b'. Each conductive pillar 142b may have a uniform width in a first, horizontal direction, as it extends along the vertical direction. Each conductive pillar 142b may be spaced apart from the heat dissipating insulation layer 130 on the sidewalls of the second semiconductor devices 120a', 120b'. Alternatively, one or more of the conductive pillars 142b may contact the heat dissipating insulation layer 130 on the sidewalls of the second semiconductor devices 120a', 120b'.

One conductive pillar 142b may be arranged between the second semiconductor devices 120a', 120b'. Two conductive pillars 142b may be arranged outwardly from the second semiconductor devices 120a', 120b' (e.g., outside of an area covered by the second semiconductor devices 120a', 120b'). However, the number, shapes, etc. of the conductive pillars is not limited thereto.

A molding member 150 may be formed on the upper surface of the package substrate 100 to cover at least a portion of the first and second semiconductor devices 110, 120a', 120b'. The molding member 150 may be formed to expose upper surfaces of the conductive pillars 142b. The molding member 150 may fill a space between the second semiconductor devices 120a', 120b' and the first conductive heat dissipation member 140.

Hereinafter, a method of manufacturing the semiconductor package in FIG. 13 will be explained.

FIGS. 15 to 20 are cross-sectional views illustrating a method of manufacturing a semiconductor package in accordance with example embodiments.

Figure 15:
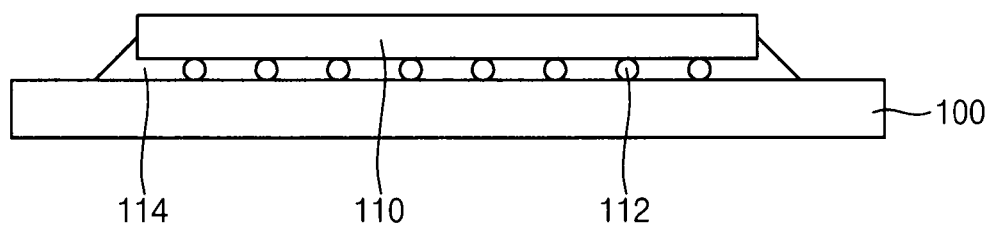
Figure 16:
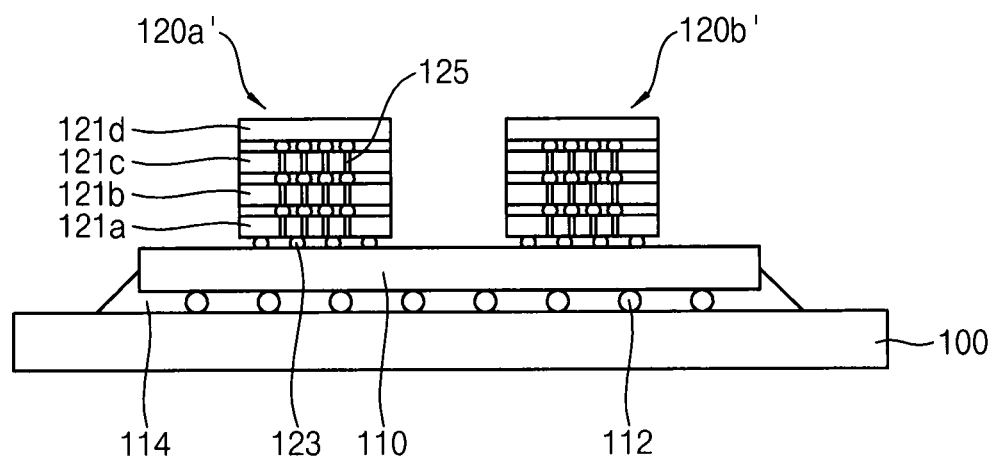

Referring to FIGS. 15 and 16, first, processes the same as or similar to processes as described with reference to FIGS.

3 and 4 may be performed such that first and second semiconductor devices 110, 120a', 120b' are formed on a package substrate 100.

In example embodiments, two second semiconductor devices 120a', 120b' may be arranged on the first semiconductor device 110 to be spaced apart from each other.

The second semiconductor device 120a', 120b' may each include a buffer die 121a and first to third memory dies 121b, 121c, 121d sequentially stacked on one another. The buffer die 121a and the first to third memory dies 121b, 121c, 121d may be electrically connected to each other by TSVs 125. The buffer die 121a and the first to third memory dies 121b, 121c, 121d may communicate data signals and control signals with each other through the TSVs 125. The buffer die 121a may be electrically connected to the first semiconductor device 110 by a plurality of conductive bumps 123.

Figure 17:
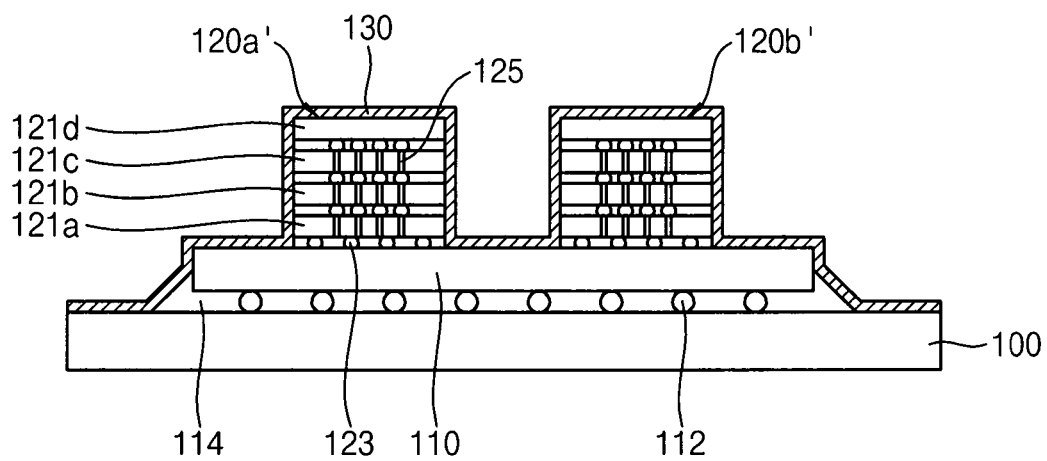
Figure 18:
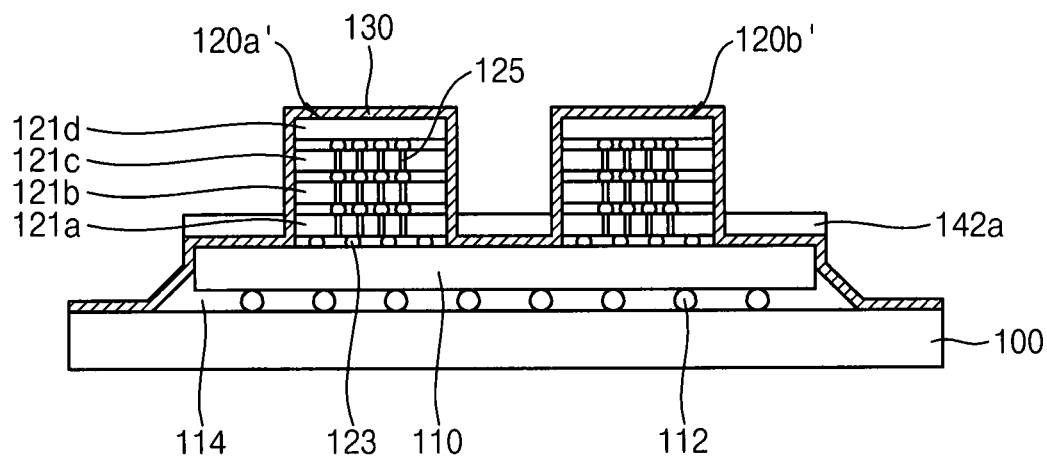
Figure 19:
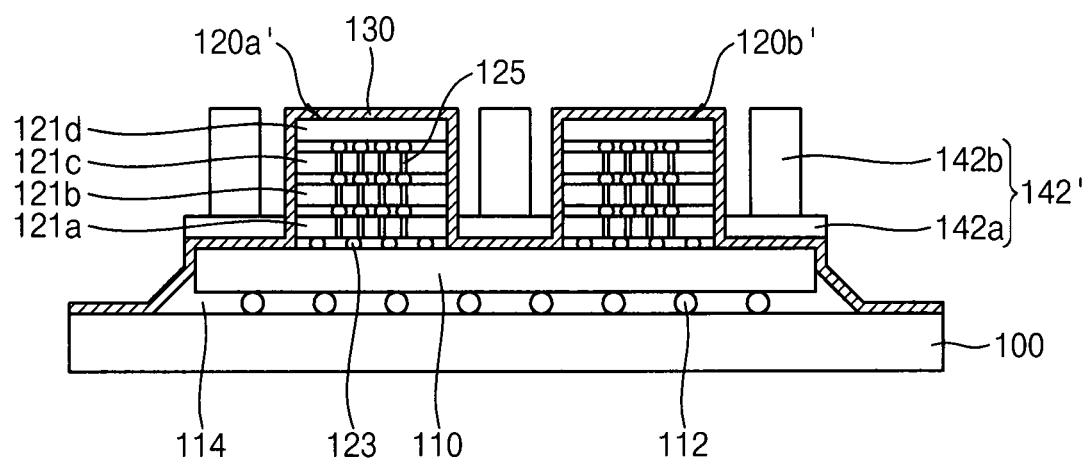

Referring to FIGS. 17 to 19, processes the same as or similar to processes as described with reference to FIGS. 5 and 6 may be performed such that a heat dissipating insulation layer 130 is coated on the first and second semiconductor devices 110, 120a', 120b' and a first conductive heat dissipation member 142' is formed on the heat dissipating insulation layer 130 on the first semiconductor device 110 exposed by the second semiconductor devices 120a', 120b'.

In example embodiments, as illustrated in FIG. 18, a metal paste may be dispensed on the heat dissipating insulation layer 130 on the first semiconductor device 110 exposed by the second semiconductor device 120a', 120b' to form a conductive plate 142a. The conductive plate 142a may be formed on the heat dissipating insulation layer 130 over the first semiconductor device 110 to extend laterally and surround the second semiconductor devices 120a', 120b'.

The conductive plate 142a may be spaced apart from the heat dissipating insulation layer 130 on sidewalls of the second semiconductor devices 120a', 120b'. Alternatively, as shown in FIG. 18, the conductive plate 142a may contact the heat dissipating insulation layer 130 on the sidewalls of the second semiconductor devices 120a', 120b'.

Then, as illustrated in FIG. 19, a metal paste may be dispensed on the conductive plate 142a to form conductive pillars 142b.

The conductive pillar 142b may extend to a height the same as heights of the second semiconductor devices 120a', 120b' with respect to the package substrate 100. The conductive pillar 142b may have a uniform width in a first, horizontal direction, as it extends along the vertical direction. The conductive pillar 142b may be spaced apart from the heat dissipating insulation layer 130 on the sidewalls of the second semiconductor devices 120a', 120b'. Alternatively, the conductive pillar 142b may contact the heat dissipating insulation layer 130 on the sidewalls of the second semiconductor devices 120a', 120b'.

Figure 20:
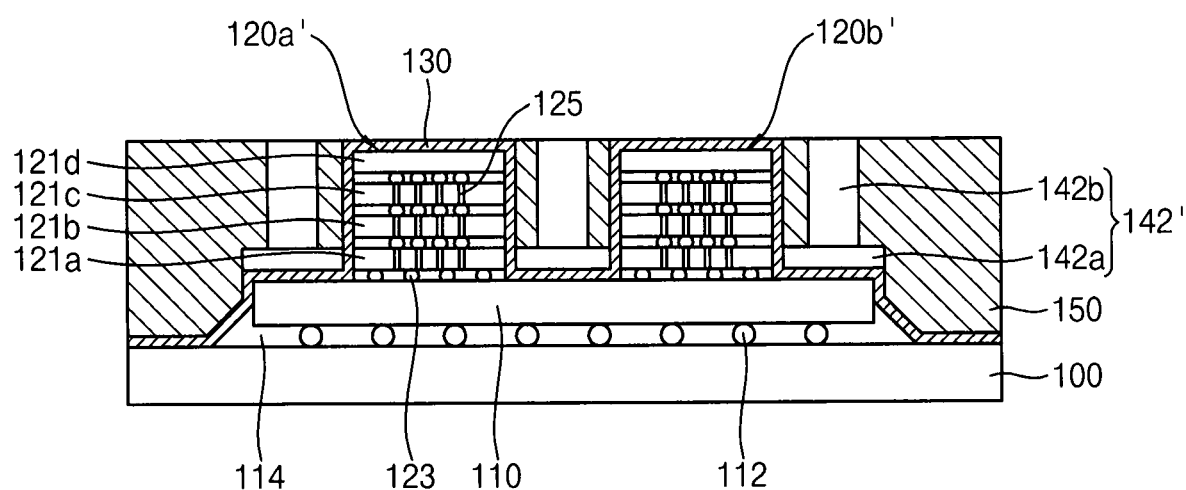

Referring to FIG. 20, a molding member 150 may be formed on the upper surface of the package substrate 100 to cover at least a portion of the first and second semiconductor devices 110, 120a', 120b'. The molding member 150 may be formed to expose upper surfaces of the conductive pillars 142b, for example to the outside of the semiconductor package. The molding member 150 may fill a space between the second semiconductor devices 120a', 120b' and the first conductive heat dissipation member 140'.

Then, external connection terminals 104 may be formed on outer connection pads on a lower surface of the package substrate 100 to complete a semiconductor package 13.

Figure 21:
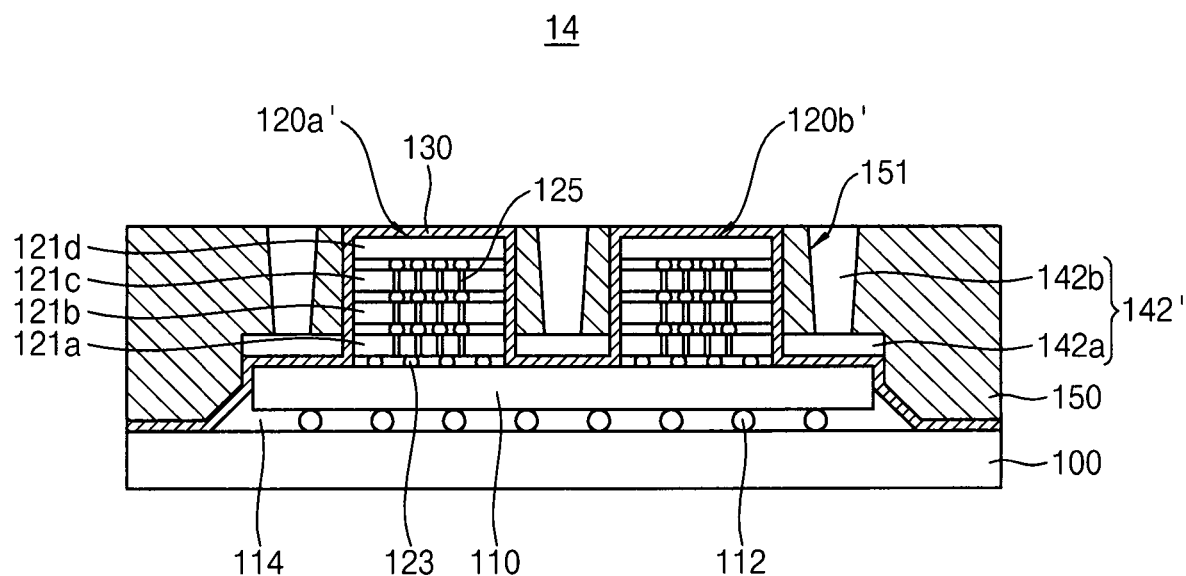

FIG. 21 is a cross-sectional view illustrating a semiconductor package in accordance with example embodiments. The semiconductor package may be substantially the same as or similar to the semiconductor package described with reference to FIG. 1 except for a conductive pillar. Thus, same reference numerals will be used to refer to the same or like elements and any further repetitive explanation concerning the above elements will be omitted.

Referring to FIG. 21, a first conductive heat dissipation member 142' of a semiconductor package 14 may include a conductive plate 142a on a heat dissipating insulation layer 130 on a first semiconductor device 110 exposed by a second semiconductor device 120a', 120b' to extend laterally and surround the second semiconductor device 120a', 120b' and at least one conductive pillar 142b extending in a vertical direction from the conductive plate 142a.

In example embodiments, a molding member 150 may have a through hole 151 formed therein to expose an upper surface of the conductive plate 142a. The conductive pillar 142b may be filled within the through hole 151.

A width of the through hole 151 may be decreased gradually toward a lower portion of the through hole 151. Accordingly, a width of the conductive pillar 142b may be increased gradually toward an upper portion of the through hole 151.

Hereinafter, a method of manufacturing the semiconductor package in FIG. 21 will be explained.

Figure 22:
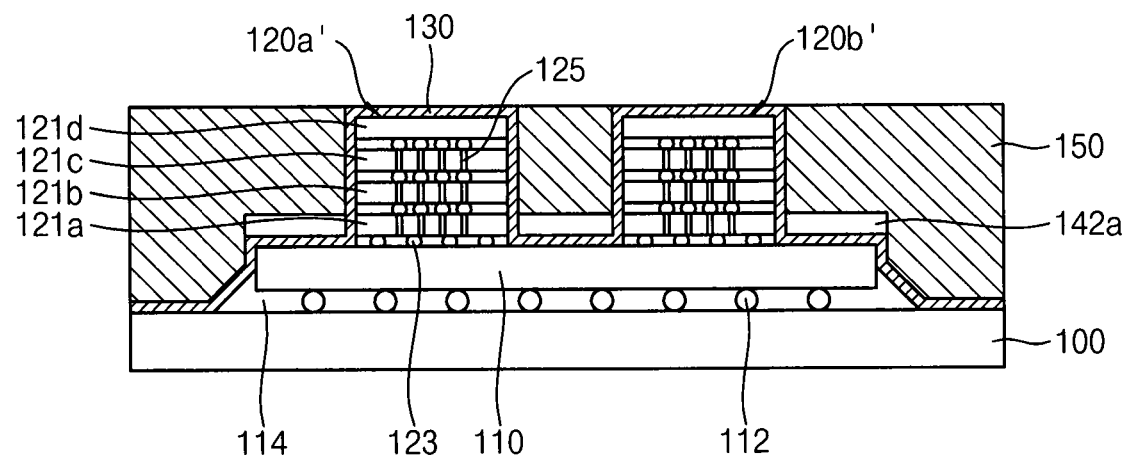
Figure 23:
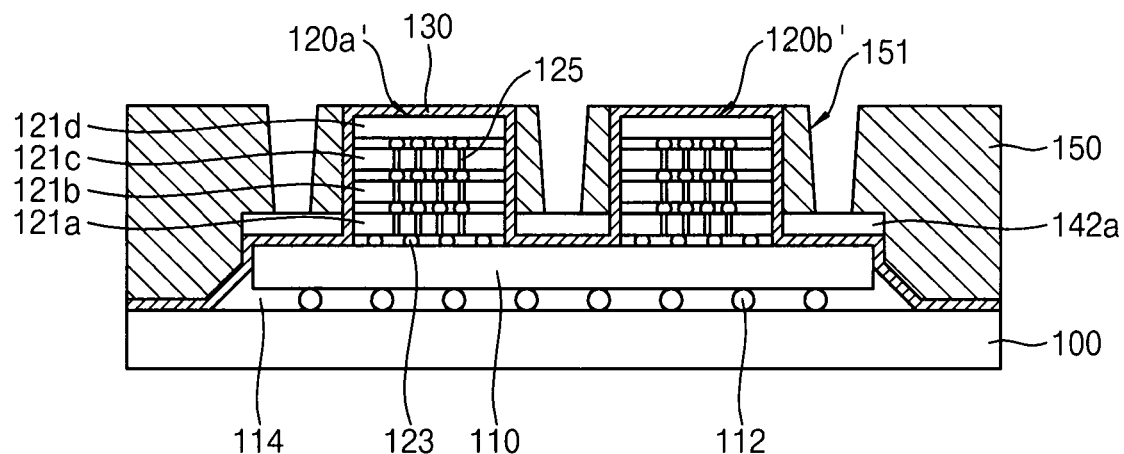
Figure 24:
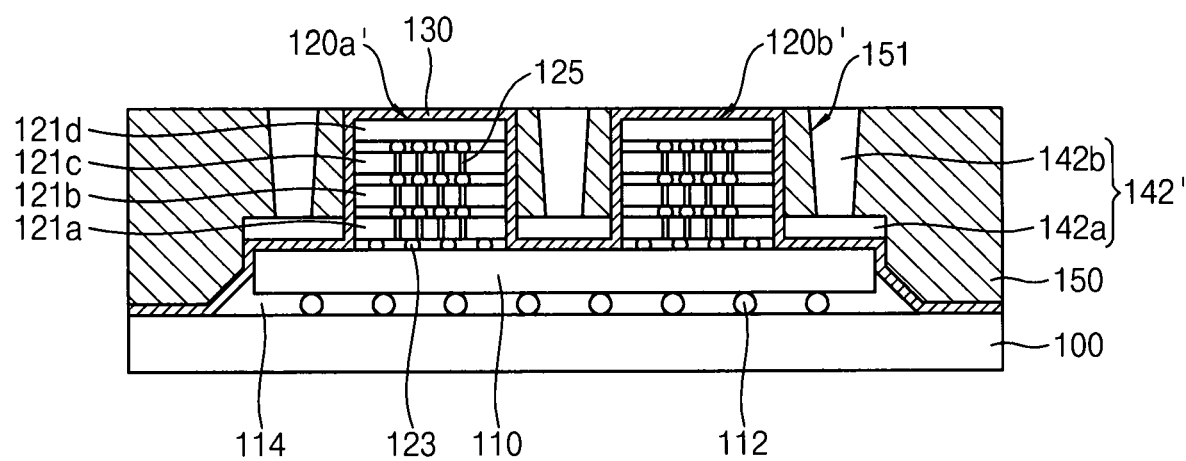

FIGS. 22 to 24 are cross-sectional views illustrating a method of manufacturing a semiconductor package in accordance with example embodiments.

Referring to FIG. 22, first, processes the same as or similar to processes as described with reference to FIGS. 15 to 20 may be performed such that a heat dissipating insulation layer 130 is coated on first and second semiconductor devices 110, 120a', 120b' on a package substrate 100 and a conductive plate 142a is formed on the heat dissipating insulation layer 130 on the first semiconductor device exposed by the second semiconductor devices 120a', 120b'. Then, a molding member 150 may be formed on an upper surface of the package substrate 100 to cover at least a portion of the first and second semiconductor devices 110, 120a', 120b' and the conductive plate 142a. The molding member 150 may be formed to expose an upper surface of the heat dissipating insulation layer 130 on the second semiconductor devices 120a', 120b'.

Referring to FIGS. 23 and 24, a conductive pillar 142b may be formed in the molding member 150 to extend in a vertical direction from the conductive plate 142a.

First, the molding member 150 may be partially removed to form a through hole 151 which exposes a portion of an upper surface of the conductive pillar 142b. For example, the through hole 151 may be formed by a laser drilling process.

Then, the through hole 151 of the molding member 150 may be filled up with a conductive material to form the conductive pillar 142b which contacts the conductive plate 142a. The conductive material may be a metal paste including a metal material such as gold (Au), silver (Ag), copper (Cu), etc. The conductive pillar 142b may be formed such that an upper surface of the conductive pillar 142b is exposed from the molding member 150. The upper surface of the conductive pillar 142b may be coplanar with a top surface of the molding member 150.

Figure 25:
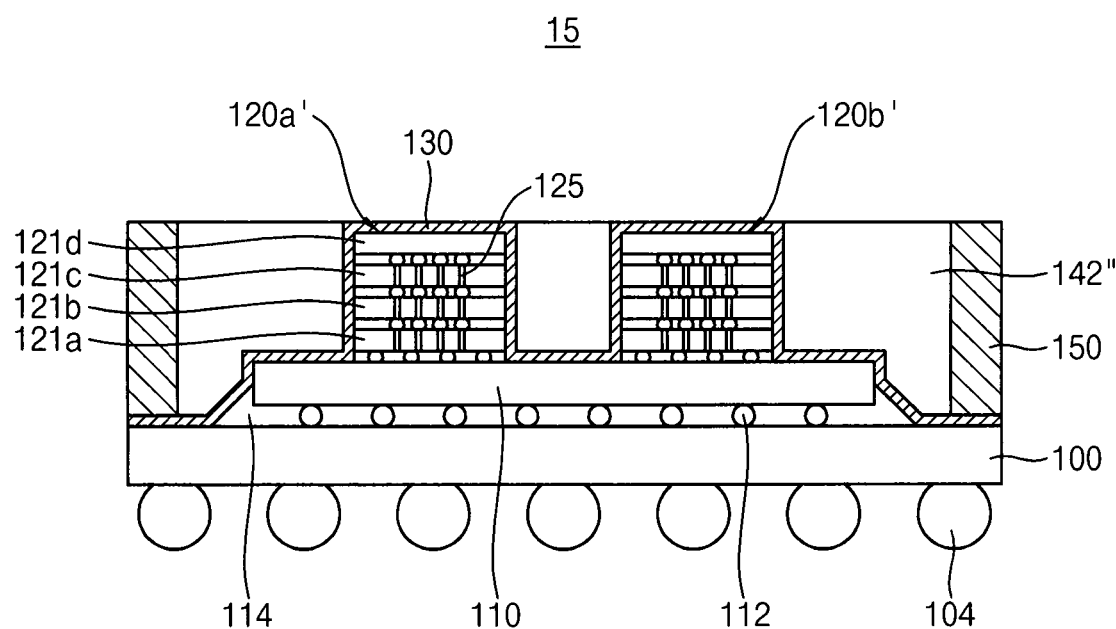

FIG. 25 is a cross-sectional view illustrating a semiconductor package in accordance with example embodiments. The semiconductor package may be substantially the same as or similar to the semiconductor package described with reference to FIG. 13 except for a first conductive heat dissipation member. Thus, same reference numerals will be used to refer to the same or like elements and any further repetitive explanation concerning the above elements will be omitted.

Referring to FIG. 25, a semiconductor package 15 may include a first conductive heat dissipation member 142" on a heat dissipating insulation layer 130 on a first semiconductor device 110 exposed by second semiconductor devices 120a', 120b'. The first conductive heat dissipation member 130 may be arranged to surround the second semiconductor devices 120a', 120b'. The first conductive heat dissipation member 142" may contact the heat dissipating insulation layer 130 on sidewalls of the second semiconductor devices 120a', 120b'.

In example embodiments, an upper surface of the package substrate 100 exposed by the first semiconductor device 110 may be coated with the heat dissipating insulation layer 130. The first conductive heat dissipation member 142" may be arranged on the heat dissipating insulation layer 130 on the package substrate 100 exposed by the first semiconductor device 110. The first conductive heat dissipation member 142" may partially cover the entire exposed surface of the package substrate 100. For example, a peripheral surface of the package substrate 100 may not be covered with the first conductive heat dissipation member 142".

Hereinafter, a method of manufacturing the semiconductor package in FIG. 25 will be explained.

Figure 26:
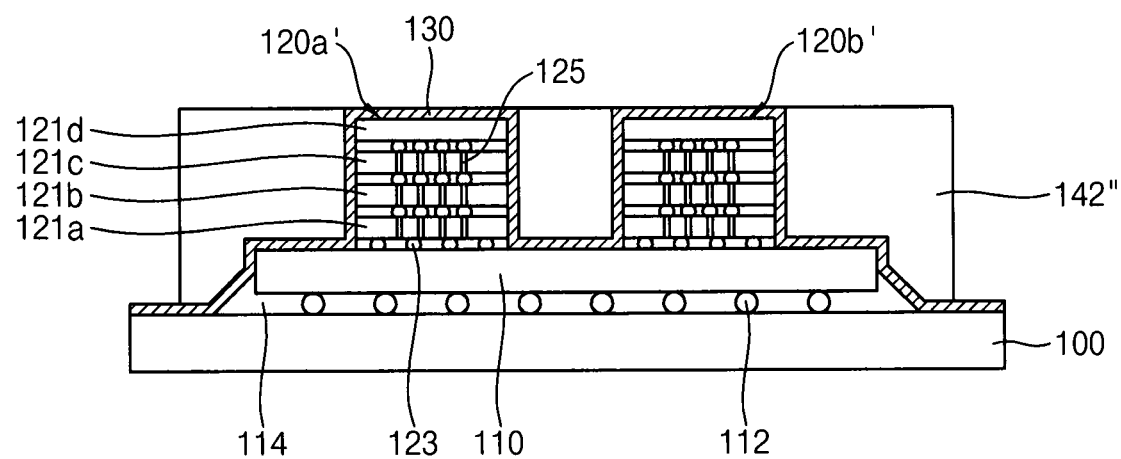
Figure 27:
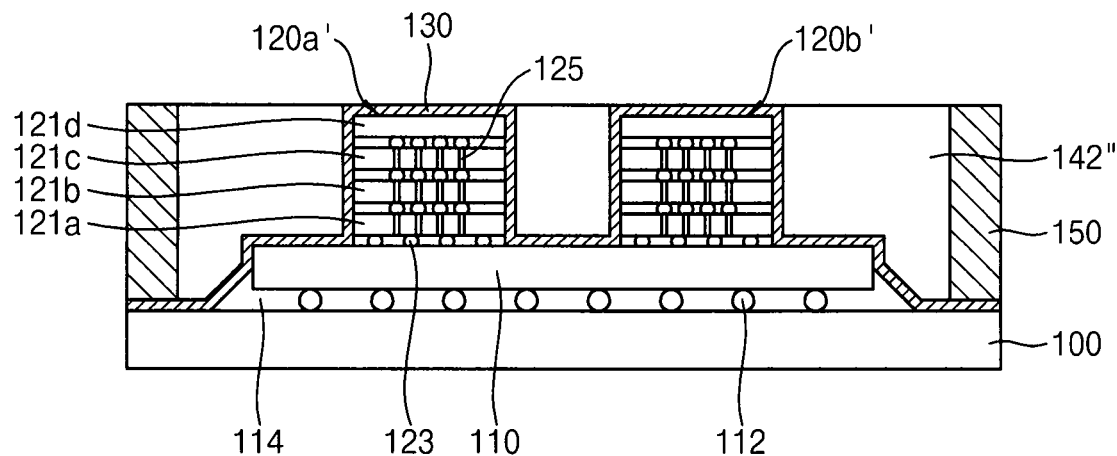

FIGS. 26 and 27 are cross-sectional views illustrating a method of manufacturing a semiconductor package in accordance with example embodiments.

Referring to FIG. 26, first, processes the same as or similar to processes as described with reference to FIGS. 15 to 17 may be performed such that a heat dissipating insulation layer 130 is coated on first and second semiconductor devices 110, 120a', 120b' on a package substrate 100. Then, a first conductive heat dissipation member 142" may be formed on the heat dissipating insulation layer 130 on the first semiconductor device 110 exposed by the second semiconductor devices 120a', 120b'.

The first conductive heat dissipation member 142' may be arranged on the heat dissipating insulation layer 130 on the package substrate 100 exposed by the first semiconductor device 110. The first conductive heat dissipation member 142" may be formed to partially cover the entire exposed surface of the package substrate 100. For example, a peripheral surface of the package substrate 100 may not be covered with the first conductive heat dissipation member 142".

Referring to FIG. 27, a molding member 150 may be formed on the upper surface of the package substrate 100 to cover at least a portion of the first and second semiconductor devices 110, 120a', 120b'. The molding member 150 may be formed on the heat dissipating insulation layer 130 on the package substrate 100 exposed by the first conductive heat dissipation member 142".

Figure 28:
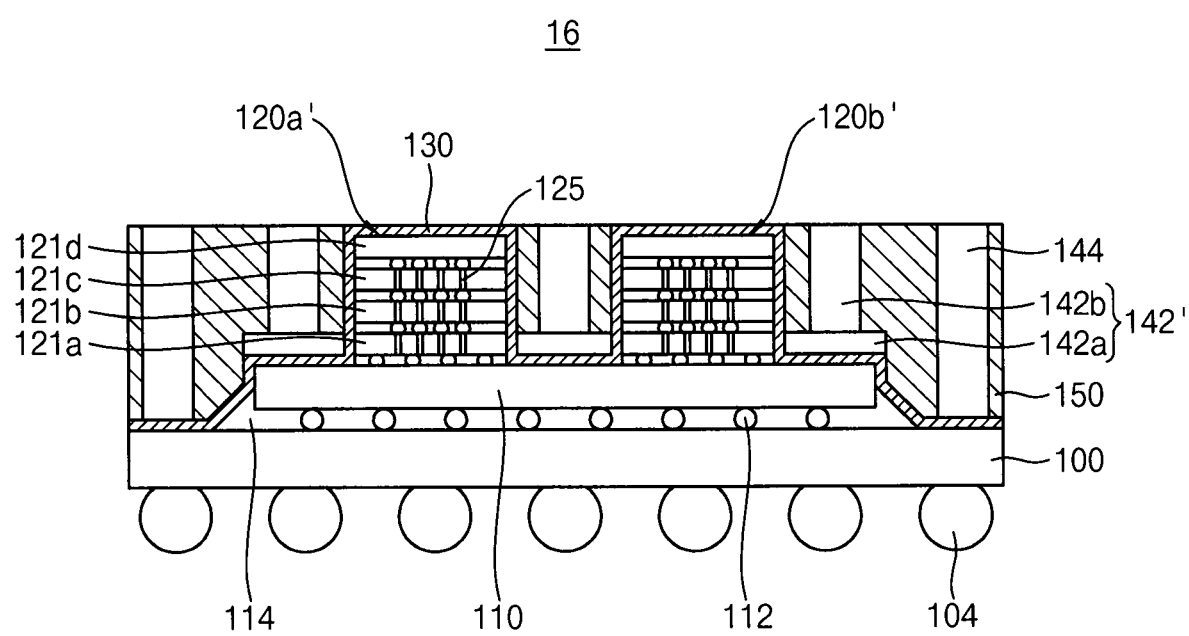

FIG. 28 is a cross-sectional view illustrating a semiconductor package in accordance with example embodiments. The semiconductor package may be substantially the same as or similar to the semiconductor package described with reference to FIG. 13 except for an additional third conductive heat dissipation member. Thus, same reference numerals will be used to refer to the same or like elements and any further repetitive explanation concerning the above elements will be omitted.

Referring to FIG. 28, a semiconductor package 16 may further include a third heat dissipation member 144 arranged on a heat dissipating insulation layer 130 on a package substrate 100.

In example embodiments, an upper surface of the package substrate 100 exposed by a first semiconductor device 110 may be coated with the heat dissipating insulation layer 130. The third conductive heat dissipation member 144 may be arranged on the heat dissipating insulation layer 130 on the package substrate 100 exposed by the first semiconductor device 110.

The third conductive heat dissipation member 144 may be formed together when a conductive pillar 142b of a first conductive heat dissipation member 142' is formed. For example, a metal paste may be dispensed on the heat dissipating insulation layer 130 on the package substrate 100 exposed by the first semiconductor device 110 to form the third conductive heat dissipation member 144. The third conductive heat dissipation member 144 may extend to a height the same as heights to which the second semiconductor devices 120a', 120b' and the conductive pillar 142b extend, with respect to the package substrate 100.

The molding member 150 may be formed to expose upper surfaces of the conductive pillars 142b and the third conductive heat dissipation member 144. The molding member 150 may fill spaces between the second semiconductor devices 120a', 120b', the first conductive heat dissipation members 142' and the third conducive heat dissipation member 144.

Figure 29:
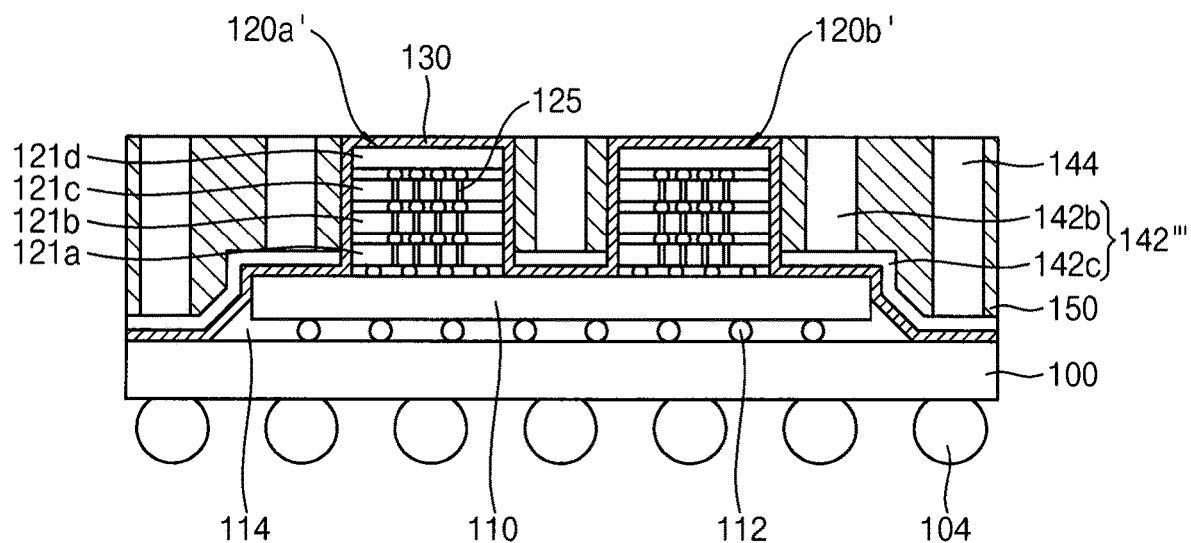

FIG. 29 is a cross-sectional view illustrating a semiconductor package in accordance with example embodiments. The semiconductor package may be substantially the same as or similar to the semiconductor package described with reference to FIG. 13 except for a first conductive heat dissipation member and a third conductive heat dissipation member. Thus, same reference numerals will be used to refer to the same or like elements and any further repetitive explanation concerning the above elements will be omitted.

Referring to FIG. 29, a semiconductor package 17 may include a first conductive heat dissipation member 142''' arranged on a heat dissipating insulation layer 130 on a first semiconductor device 110 exposed by second semiconductor devices 120a', 120b' and a third conductive heat dissipation member 144 arranged on the heat dissipating insulation layer 130 on the package substrate 100.

The first conductive heat dissipation member 142''' may include a conductive plate 142c on the heat dissipating insulation layer 130 on the first semiconductor device 110 and on the package substrate 100 exposed by the first semiconductor device 110 to extend laterally and a conductive pillar 142b extending in a vertical direction from the conductive plate 142c on the first semiconductor device 110 exposed by the second semiconductor devices 120a', 120b'.

The third conductive heat dissipation member 144 may extend in the vertical direction from the conductive plate 142c on the package substrate 100 exposed by the first semiconductor device 110.

The third conductive heat dissipation member 144 may be formed together when the conductive pillar 142b of the first conductive heat dissipation member 142''' is formed. For example, a metal paste may be dispensed on the heat dissipating insulation layer 130 on the package substrate 100 exposed by the first semiconductor device 110 to form the third conductive heat dissipation member 144. The third conductive heat dissipation member 144 may extend to a height the same as heights to which the second semiconductor devices 120a', 120b' and the conductive pillar 142b extend with respect to the package substrate 100.

The molding member 150 may be formed to expose upper surfaces of the conductive pillars 142b and the third conductive heat dissipation member 144. The molding member 150 may fill spaces between the second semiconductor devices 120a', 120b', the first conductive heat dissipation members 142b and the third conducive heat dissipation member 144.

Figure 30:
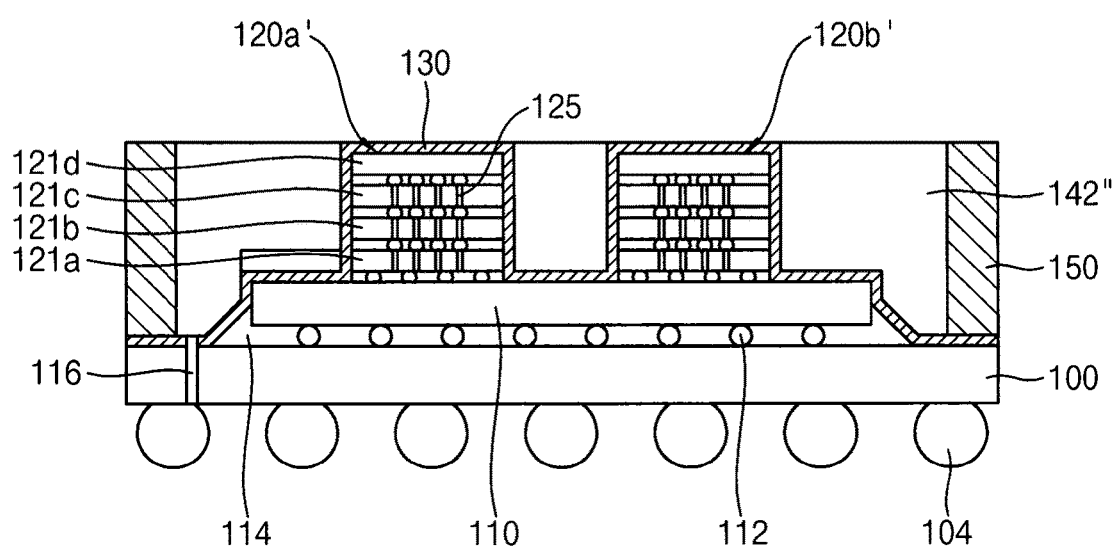

FIG. 30 is a cross-sectional view illustrating a semiconductor package in accordance with example embodiments. The semiconductor package may be substantially the same as or similar to the semiconductor package described with reference to FIG. 25 except for an additional ground wire connected to a first conductive heat dissipation member. Thus, same reference numerals will be used to refer to the same or like elements and any further repetitive explanation concerning the above elements will be omitted.

Referring to FIG. 30, a package substrate 100 of a semiconductor package 18 may include a ground wire 116 electrically connected to a first conductive heat dissipation member 142".

In example embodiments, a first conductive heat dissipation member 142" may be arranged on a heat dissipating insulation layer 130 on the package substrate 100 exposed by a first semiconductor device 110. The ground wire 116 may be electrically connected to the first conductive heat dissipation member 142" on the package substrate 100 such that the first conductive heat dissipation member 142" is grounded.

Figure 31:
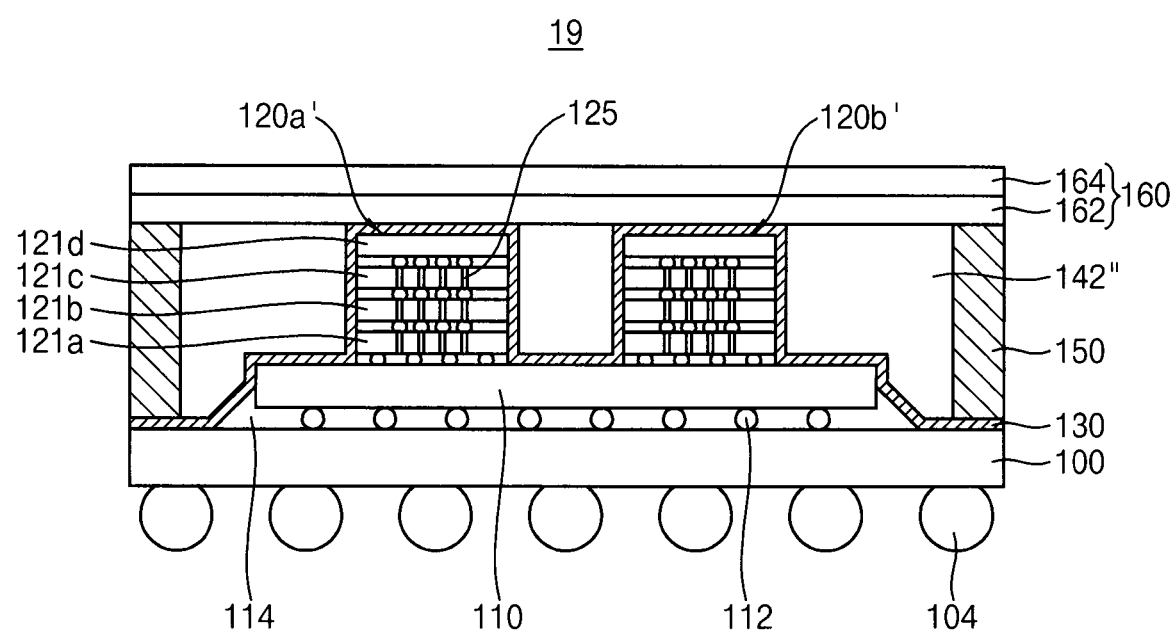

FIG. 31 is a cross-sectional view illustrating a semiconductor package in accordance with example embodiments. The semiconductor package may be substantially the same as or similar to the semiconductor package described with reference to FIG. 25 except for an addition heat sink. Thus, same reference numerals will be used to refer to the same or like elements and any further repetitive explanation concerning the above elements will be omitted.

Referring to FIG. 31, a semiconductor package 19 may further include a heat sink 160 covering a first conductive heat dissipation member 142". The heat sink 160 may include an electrically conductive adhesive layer 162 and a heat dissipating plate 164.

The heat sink 160 may be thermally connected to the first conductive heat dissipation member 142" exposed by a molding member 150. The heat sink 160 may have a planar area corresponding to the package substrate 100.

An electronic device including a semiconductor package in accordance with example embodiments may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like. The electronic device may be embodied by a personal computer PC or a portable electronic device such as a notebook, a cell phone, a personal digital assistant (PDA) and a camera.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a package substrate;
a first semiconductor device arranged on the package substrate;
at least one second semiconductor device on the first semiconductor device to partially cover the first semiconductor device from a top down view;
a heat dissipating insulation layer coated on the first semiconductor device and the at least one second semiconductor device, the heat dissipating insulation layer formed of an electrically insulating and thermally conductive material;
a conductive heat dissipation structure arranged on the heat dissipating insulation layer on a portion of the first semiconductor device not covered by the second semiconductor device, the conductive heat dissipation structure formed of an electrically and thermally conductive material; and
a molding layer on the package substrate to cover the first semiconductor device and the at least one second semiconductor device, wherein:
the molding layer covers a first portion of a top surface of the at least one second semiconductor device,
the conductive heat dissipation structure covers a second portion of the top surface of the at least one second semiconductor device, and
the molding layer is not formed between the conductive heat dissipation structure and the second portion of the top surface of the at least one second semiconductor device.

2. The semiconductor package of claim 1, wherein:
the conductive heat dissipation structure includes a first portion that vertically overlaps the portion of the first semiconductor device and a second portion that vertically overlaps and is arranged on the heat dissipating insulation layer on the at least one second semiconductor device.

3. The semiconductor package of claim 2, wherein the first portion of the conductive heat dissipation structure is formed integrally with the second portion of the conductive heat dissipation structure.

4. The semiconductor package of claim 2, wherein the second portion of the conductive heat dissipation structure extends to a height the same as a height to which the first portion of the conductive heat dissipation structure extends.

5. The semiconductor package of claim 1, wherein an upper surface of the conductive heat dissipation structure is exposed by the molding layer.

6. The semiconductor package of claim 1, wherein each second semiconductor device of the at least one second semiconductor device is electrically connected to the package substrate by bonding wires.

7. The semiconductor package of claim 6, wherein the heat dissipating insulation layer covers the bonding wires.

8. The semiconductor package of claim 7, further comprising:
a second conductive heat dissipation structure arranged on the heat dissipating insulation layer on each second semiconductor device of the at least one second semiconductor device and covering the bonding wires.

9. The semiconductor package of claim 1, wherein the heat dissipating insulation layer is conformally formed on top surfaces of the first semiconductor device and the at least one second semiconductor device, and on side surfaces of the at least one second semiconductor device.

10. The semiconductor package of claim 1, wherein the heat dissipating insulation layer is formed of an oxide, nitride or ceramic, and the conductive heat dissipation structure is formed of a metal.

11. The semiconductor package of claim 1, the conductive heat dissipation structure spans a length in a first horizontal direction that is greater than a distance spanned by three adjacent pads formed on the package substrate.

12. The semiconductor package of claim 1, wherein the conductive heat dissipation structure is electrically insulated from any circuitry of the first semiconductor device, the at least one second semiconductor device, and the package substrate, and does not transfer electrical signals to or from the first semiconductor device, the at least one second semiconductor device, or the package substrate.

13. The semiconductor package of claim 1, wherein the first semiconductor device is a logic chip, and each second semiconductor device is a memory device including one or more memory chips.

14. The semiconductor package of claim 1, wherein the heat dissipating insulation layer is coated on an upper surface of the at least one second semiconductor device.

15. A semiconductor package, comprising:
a package substrate;
a first semiconductor device arranged on the package substrate;
at least one second semiconductor device on the first semiconductor device to partially cover the first semiconductor device from a top down view;
a heat dissipating insulation layer coated on the first semiconductor device and the at least one second semiconductor device, the heat dissipating insulation layer formed of an electrically insulating and thermally conductive material;
a conductive heat dissipation structure arranged on the heat dissipating insulation layer on a portion of the first semiconductor device not covered by the second semiconductor device, the conductive heat dissipation structure formed of an electrically and thermally conductive material; and
a molding layer on the package substrate to cover the first semiconductor device and the at least one second semiconductor device,
wherein the conductive heat dissipation structure comprises:
a conductive plate on the heat dissipating insulation layer to extend laterally and surround each second semiconductor device of the at least one second semiconductor device; and
at least a first conductive pillar extending in a vertical direction from the conductive plate.

16. The semiconductor package of claim 15, wherein an upper surface of the package substrate is coated with the heat dissipating insulation layer.

17. The semiconductor package of claim 15,
wherein an upper surface of the package substrate is coated with the heat dissipating insulation layer, and the conductive plate is arranged on the heat dissipating insulation layer on the package substrate, and
wherein the conductive heat dissipation structure further includes at least a second conductive pillar extending in a vertical direction from the conductive plate on the package substrate.

18. An electronic device, comprising:
a substrate;
a first electronic product arranged on the substrate;
at least one second electronic product on the first electronic product to partially cover the first electronic product from a top-down view;
a heat dissipating insulation layer coated on at least top surfaces of the substrate and the first and second electronic products, the heat dissipating insulation layer formed of an electrically insulating and thermally conductive material;
a first conductive heat dissipation member arranged on the heat dissipating insulation layer on a portion of the first electronic product not covered by the second electronic product, the first conductive heat dissipation member formed of an electrically and thermally conductive material; and
a molding member on the substrate to cover the first and second electronic products.

19. The electronic device of claim 18, further comprising:
a second conductive heat dissipation member arranged on the heat dissipating insulation layer on the second electronic product.

20. The electronic device of claim 18, wherein the first conductive heat dissipation member comprises:
a conductive plate on the heat dissipating insulation layer to extend laterally and surround the second electronic product; and
at least one conductive pillar extending in a vertical direction from the conductive plate.

21. The electronic device of claim 18, wherein the electronic device is a semiconductor package, the first electronic product is a first semiconductor device, and the at least one second electronic product is at least one second semiconductor device.

22. The electronic device of claim 18, wherein a top surface of the molding member and a top surface of the first conductive heat dissipation member are coplanar and form part of a top surface of the electronic device.

* * * * *